(12) United States Patent
Kim et al.

(10) Patent No.: US 9,570,510 B2
(45) Date of Patent: Feb. 14, 2017

(54) MAGNETORESISTIVE RANDOM ACCESS MEMORY DEVICES AND METHODS OF MANUFACTURING THE SAME

(71) Applicants: Eun-Jung Kim, Daegu (KR);
Se-Myeong Jang, Anyang-si (KR);
Dae-Ik Kim, Hwaseong-si (KR);
Je-Min Park, Suwon-si (KR);
Yoo-Sang Hwang, Suwon-si (KR)

(72) Inventors: Eun-Jung Kim, Daegu (KR);
Se-Myeong Jang, Anyang-si (KR);
Dae-Ik Kim, Hwaseong-si (KR);
Je-Min Park, Suwon-si (KR);
Yoo-Sang Hwang, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/724,725

(22) Filed: May 28, 2015

(65) Prior Publication Data

US 2016/0020251 A1 Jan. 21, 2016

(30) Foreign Application Priority Data

Jul. 18, 2014 (KR) .................. 10-2014-0090858

(51) Int. Cl.
*H01L 29/82* (2006.01)
*H01L 27/22* (2006.01)
(Continued)

(52) U.S. Cl.
CPC .......... *H01L 27/228* (2013.01); *H01L 29/7827* (2013.01); *H01L 43/08* (2013.01)

(58) Field of Classification Search
CPC ..... H01L 27/228; H01L 29/7827; H01L 43/02
(Continued)

(56) References Cited

U.S. PATENT DOCUMENTS

| 8,420,485 B2 | 4/2013 | Cho et al. |
| 2010/0001356 A1* | 1/2010 | Kim ................ H01L 43/12 257/421 |

(Continued)

FOREIGN PATENT DOCUMENTS

| KR | 101060578 | 8/2011 |
| KR | 101095080 | 12/2011 |
| KR | 20120038209 A | 4/2012 |

*Primary Examiner* — Benjamin Sandvik
*Assistant Examiner* — Herve Assouman
(74) *Attorney, Agent, or Firm* — Renaissance IP Law Group LLP

(57) ABSTRACT

An MRAM device may include semiconductor structures, a common source region, a drain region, a channel region, gate structures, word line structures, MTJ structures, and bit line structures arranged on a substrate. Each of the semiconductor structures may include a first semiconductor pattern having a substantially linear shape extending in a first direction that is substantially parallel to a top surface of the substrate, and a plurality of second patterns that each extend in a third direction substantially perpendicular to the top surface of the substrate. A common source region and drain region may be formed in each of the semiconductor structures to be spaced apart from each other in the third direction, and the channel region may be arranged between the common source region and the drain region. Gate structures may be formed between adjacent second semiconductor patterns in the second direction. Word line structures may electrically connect gate structures arranged in the first direction to each other. MTJ structures may be electrically connected to corresponding ones of the second semiconductor patterns. Each bit line structure may electrically connect two adjacent MTJ structures in the first direction to each other.

20 Claims, 40 Drawing Sheets

(51) Int. Cl.
*H01L 29/78* (2006.01)
*H01L 43/08* (2006.01)

(58) Field of Classification Search
USPC .............................. 257/421, 422; 438/3, 268
See application file for complete search history.

(56) References Cited

U.S. PATENT DOCUMENTS

| | | |
|---|---|---|
| 2011/0269251 A1 | 11/2011 | Kim et al. |
| 2012/0119286 A1* | 5/2012 | Kim .................. H01L 27/10876 257/329 |
| 2012/0241826 A1* | 9/2012 | Satoh .................... H01L 27/228 257/295 |
| 2013/0040408 A1* | 2/2013 | Nam ................. H01L 21/76897 438/3 |
| 2013/0043525 A1 | 2/2013 | Yu et al. |
| 2013/0056812 A1* | 3/2013 | Kim ..................... H01L 27/228 257/295 |
| 2014/0021428 A1 | 1/2014 | Kakegawa et al. |

* cited by examiner

FIG. 7
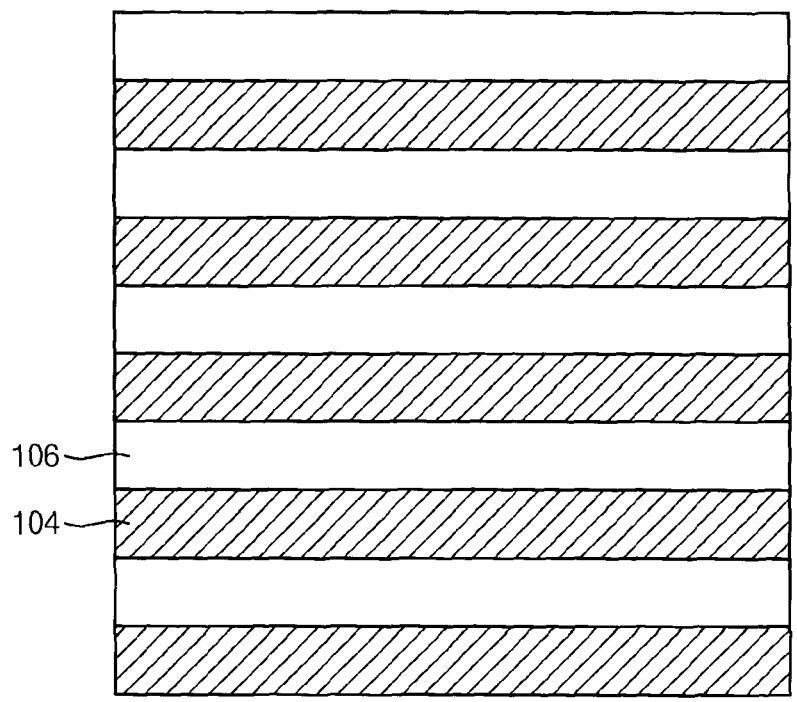
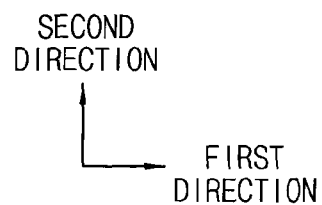

FIG. 9
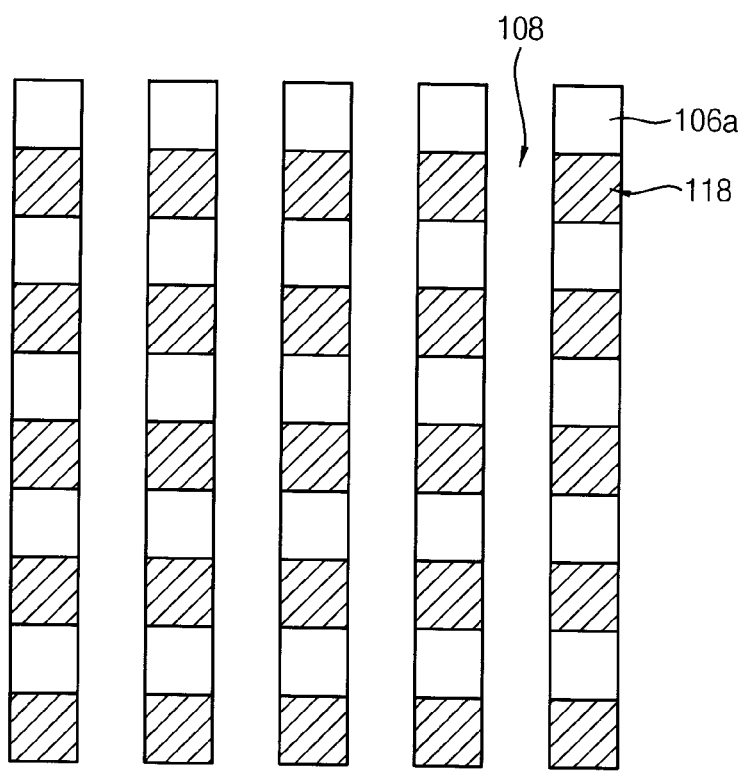
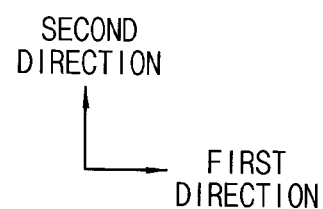

FIG. 10
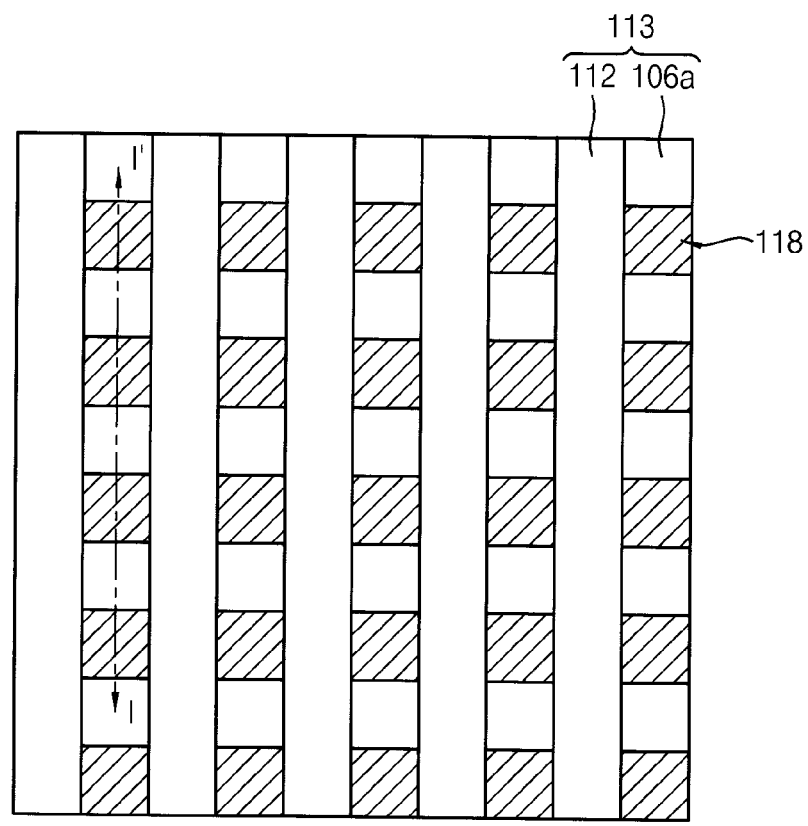
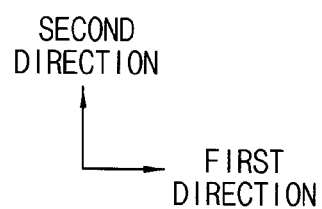

FIG. 13
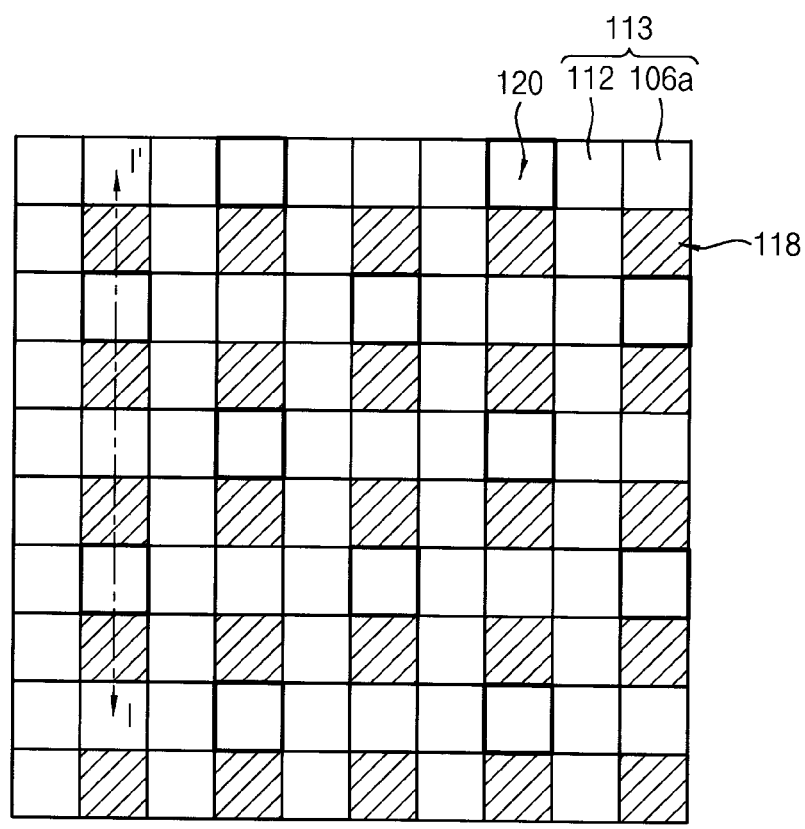
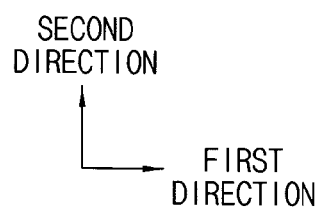

FIG. 15
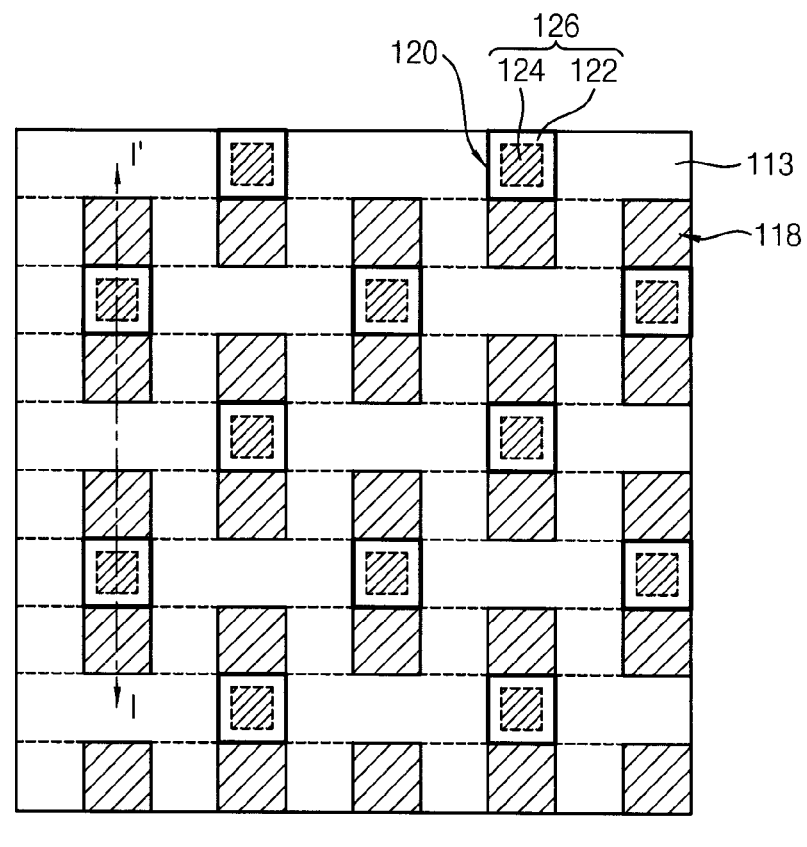
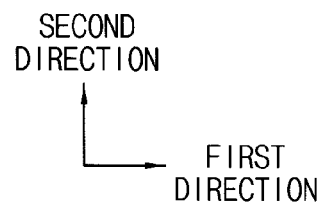

FIG. 17
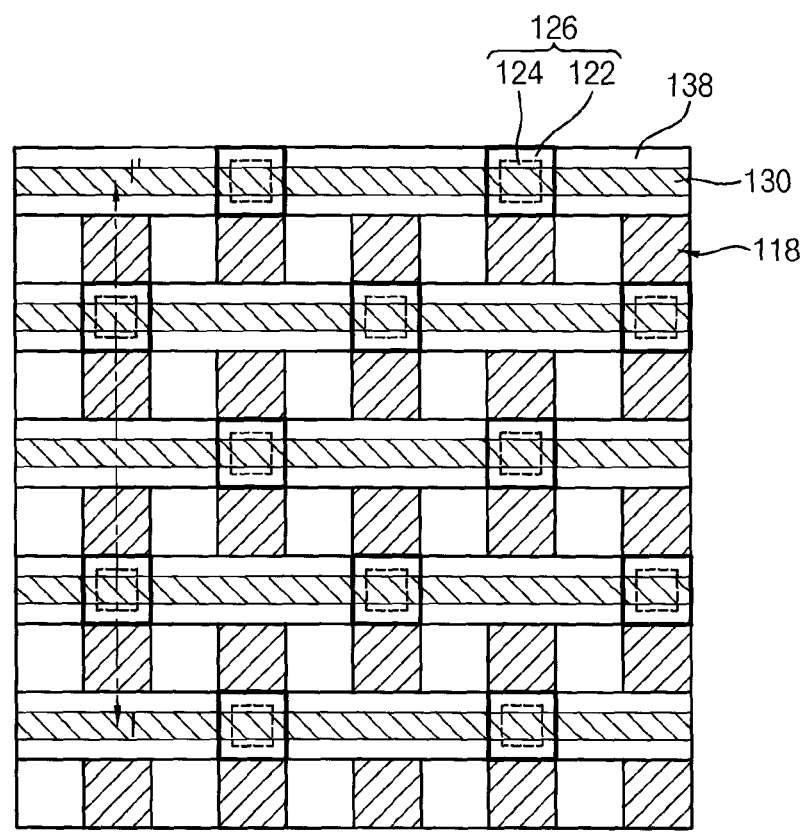
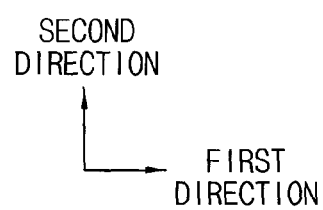

FIG. 19
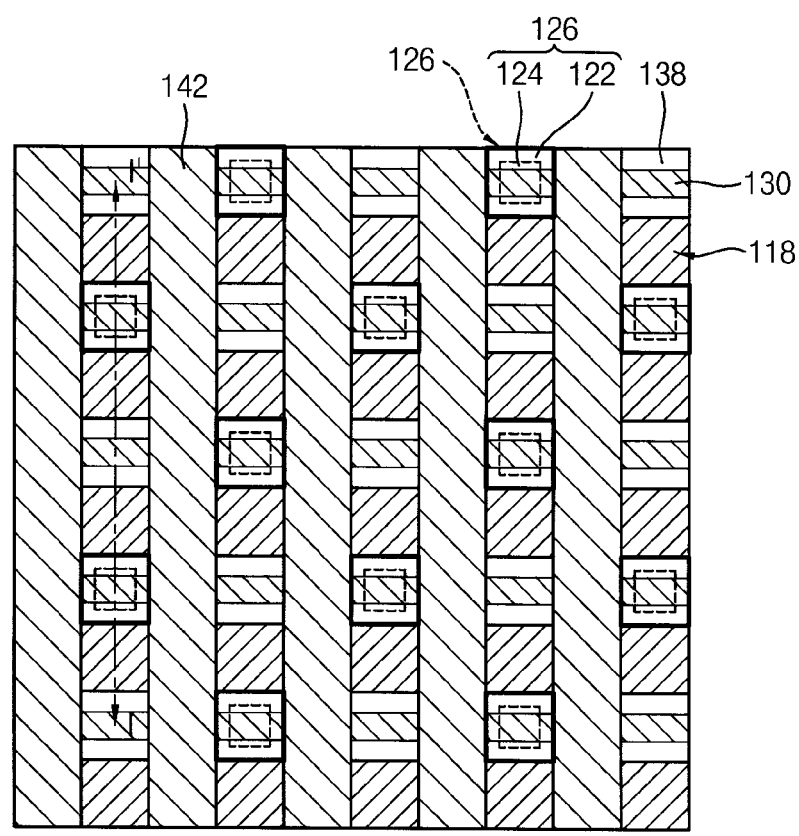
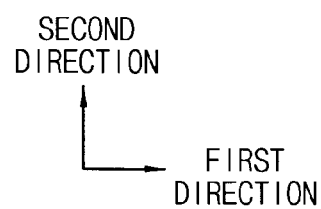

FIG. 23
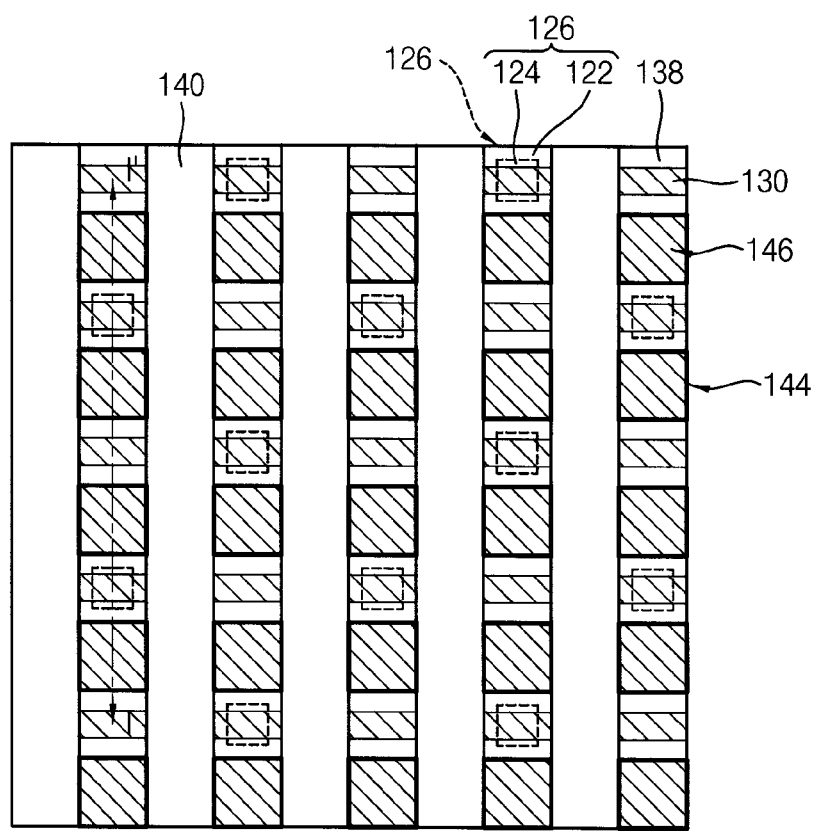
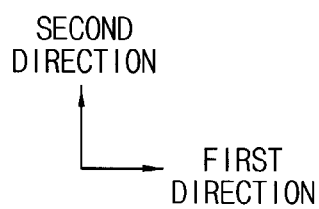

FIG. 27
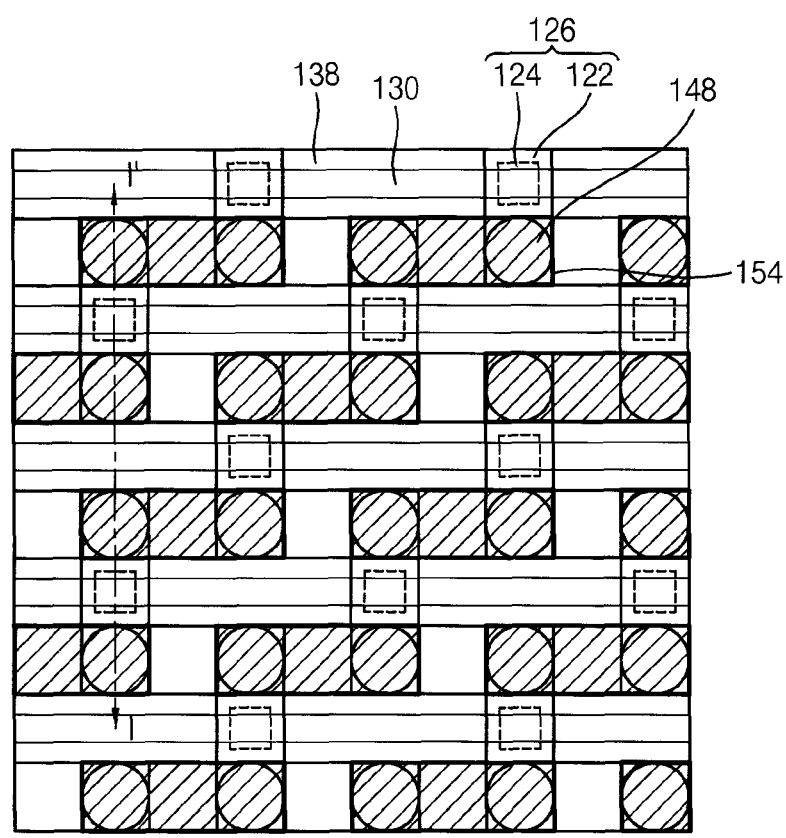
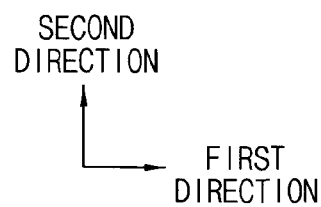

FIG. 29
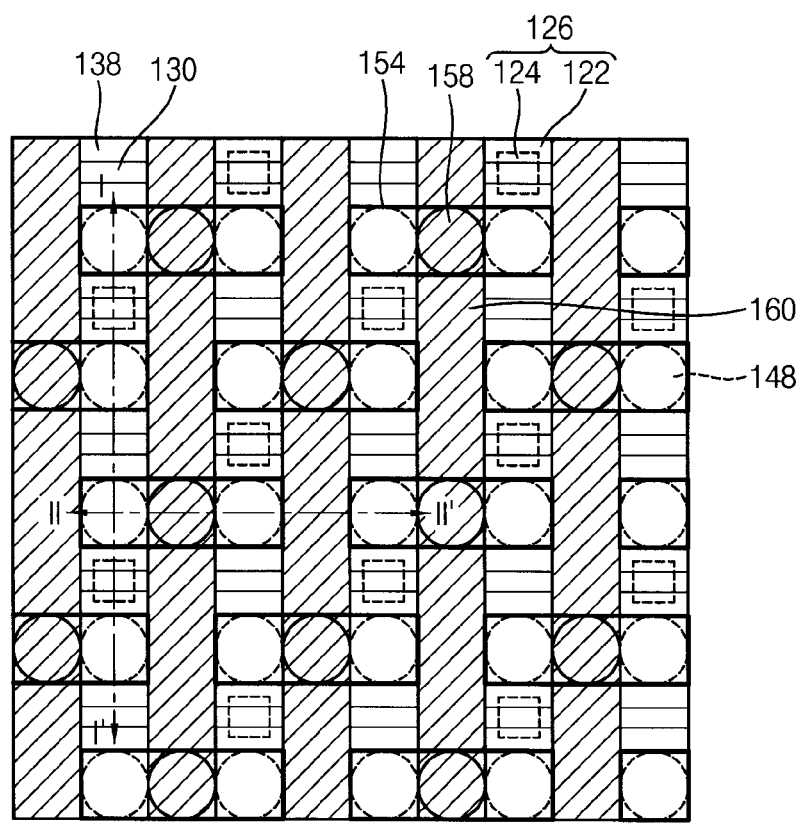
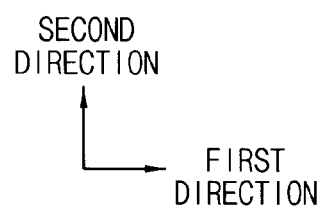

MAGNETORESISTIVE RANDOM ACCESS MEMORY DEVICES AND METHODS OF MANUFACTURING THE SAME

CROSS-REFERENCE TO RELATED APPLICATION

This application claims priority under 35 USC §119 to Korean Patent Application No. 10-2014-0090858, filed on Jul. 18, 2014 in the Korean Intellectual Property Office (KIPO), the contents of which are herein incorporated by reference in their entirety.

BACKGROUND

1. Field

Example embodiments relate to semiconductor memory devices and methods of manufacturing the same. More particularly, example embodiments relate to magnetoresistive random access memory (MRAM) devices and methods of manufacturing the same.

2. Description of the Related Art

A transistor having a vertical channel has been developed in order to increase the integration density of MRAM devices. The vertical channel transistor may, for instance, be used as a selection transistor of a memory cell in an MRAM device. A highly integrated MRAM device having good operating characteristics is needed, along with a method of manufacturing the same.

SUMMARY

Example embodiments provide a highly integrated MRAM device.

Example embodiments provide a method of manufacturing a highly integrated MRAM device.

According to example embodiments, an MRAM device may include semiconductor structures, a common source region, a drain region, a channel region, gate structures, word line structures, MTJ structures and bit line structures. The semiconductor structures may be formed on a substrate. Each of the semiconductor structures may include a first semiconductor pattern and a plurality of second semiconductor patterns. The first semiconductor pattern may have a linear shape extending in a first direction, where the first direction is substantially parallel to a top surface of the substrate. Each of the second semiconductor patterns may extend in a third direction, where the third direction is substantially perpendicular to the top surface of the substrate. The semiconductor structures may be arranged in a second direction, where the second direction is substantially perpendicular to the first direction. The common source region, the drain region, and the channel region may be formed in each of the semiconductor structures. The common source region and the drain region may be spaced apart from each other in the third direction, and the channel region may be located between the common source region and the drain region. The gate structures may be formed between at least some adjacent ones of the second semiconductor patterns. Each of the gate structures may serve as a common gate electrode. The word line structures electrically connect first gate structures arranged along the first direction. The MTJ structures electrically connect to upper portions of respective ones of the second semiconductor patterns. Each of the bit line structures electrically connects to two adjacent MTJ structures in the first direction, wherein the two adjacent MTJ structures provide an MTJ structure group. Each of the bit line structures further connects to a plurality of MTJ structure groups arranged in the second direction.

In example embodiments, each of the gate structures may have a pillar shape.

In example embodiments, each of the gate structures may include a gate insulation layer and a gate electrode. The gate insulation layer may contact sidewalls of semiconductor structures adjacent to each other in the second direction, and may have a cup shape surrounding a sidewall and a lower surface of the gate electrode.

In example embodiments, the second semiconductor patterns may include third semiconductor patterns abutting the gate structures in the second direction and fourth semiconductor patterns not abutting the gate structures in the second direction. The third and fourth semiconductor patterns may be alternately disposed in the first direction.

In example embodiments, bottom surfaces of the gate structures may be substantially coplanar with, or lower than, an upper surface of the common source line.

In example embodiments, each of the word line structures may extend in the first direction on the gate structures.

In example embodiments, the common source line and the drain region may be doped with impurities having a first conductivity type. The common source line may be formed in the first semiconductor pattern, and the drain region may be formed at an upper portion of the second semiconductor pattern.

In example embodiments, the channel region may be formed in the second semiconductor pattern between the common source line and the drain region, and may be doped with impurities having a second conductivity type that is different from the first conductivity type.

In example embodiments, the MRAM device may further include a channel body region formed on the common source line of the first semiconductor pattern. The channel body region may be electrically connected to a lower portion of the channel region and may extend in the first direction. The channel body may be doped with impurities having a second conductivity type that is different from the first conductivity type.

In example embodiments, the common source line may be formed at sidewalls of the first semiconductor pattern. The MRAM device may further include a channel body region arranged in the first semiconductor pattern between the common source lines, wherein the channel body region may be electrically connected to a lower portion of the channel region and may extend in the first direction, and wherein the channel body region may be doped with impurities having a second conductivity type that is different from the first conductivity type.

In example embodiments, the MRAM device may further include pad patterns and upper contacts. The pad patterns may be formed on the MTJ structures. Each of the pad patterns may electrically connected to two adjacent MTJ structures in the first direction. The upper contacts may contact the bit line on the pad patterns, respectively.

In example embodiments, the pad patterns may be disposed in a zigzag fashion in the first direction.

According to example embodiments, an MRAM device may include semiconductor structures, a common source region, a drain region, a channel region, a channel body region, gate structures, word line structures, MTJ structures, and bit line structures. The semiconductor structures may be formed on a substrate. Each of the semiconductor structures may include a first semiconductor pattern and second semiconductor patterns. The first semiconductor pattern may have a substantially linear shape extending in a first direction that is substantially parallel to a top surface of the substrate, and each of the second semiconductor patterns may extend in a third direction that is substantially perpendicular to the top surface of the substrate. The semiconductor structures may be arranged in a second direction that is substantially perpendicular to the first direction. The common source region, the drain region, and the channel region may be formed in each of the semiconductor structures. The common source region and the drain region may be spaced apart from each other in the third direction, and the channel region may be arranged between the common source region and the drain region. The channel body region may be formed in the second semiconductor pattern. The channel body region may be electrically connected to the channel region and may extend in the first direction. The gate structures may be formed between at least some of the second semiconductor patterns adjacent to each other in the second direction. Each of the gate structures may serve as a shared gate electrode. The word line structures electrically connect first gate structures. The MTJ structures are electrically connected to upper portions of respective ones of the second semiconductor patterns. Each of the bit line structures electrically connects to two adjacent MTJ structures in the first direction (providing an MTJ structure group), and also electrically connects to a plurality of MTJ structure groups arranged in the second direction.

In example embodiments, the common source line and the drain region may be doped with impurities having a first conductivity type. The common source line and the drain region may be sequentially formed in the first semiconductor pattern and may extend in the first direction.

In example embodiments, the common source line and the channel body region may be doped with impurities having different conductivity types from each other, and the common source line may be formed at sidewalls of the first semiconductor pattern. The channel body region may be formed between common source lines of the first semiconductor pattern.

According to example embodiments, an MRAM device may include a common source line, a shared word line, a shared bit line, and a shared channel body region. A size of each of the memory cells in the MRAM device may therefore be reduced. Also, accumulated charges of a channel region may be controlled by the channel body region, so that a risk of switching failures of a transistor due to a floating body effect may be decreased. Thus, an MRAM device may be provided having good characteristics.

BRIEF DESCRIPTION OF THE DRAWINGS

Example embodiments will be more clearly understood from the following detailed description taken in conjunction with the accompanying drawings. FIGS. 1 to 39 represent non-limiting, example embodiments as described herein.

FIG. 1 is a plan view illustrating an MRAM device in accordance with example embodiments;

FIG. 2 provides cross-sectional views of the MRAM device of FIG. 1, taken along lines I-I' and II-II';

FIGS. 3, 4A, 4B, and 4C are perspective views illustrating portions of the MRAM device of FIG. 1;

FIG. 5 is a block diagram of the MRAM device of FIG. 1, illustrating a method of selecting memory cells in accordance with example embodiments;

FIGS. 6 to 30 are plan views, cross-sectional views, and perspective views illustrating the MRAM device of FIG. 1 during various stages of manufacturing;

FIG. 31 is a plan view of an MRAM device in accordance with other example embodiments;

FIG. 32 includes cross-sectional views of the MRAM device of FIG. 31 taken along lines I-I' and II-II';

FIG. 33 is a cross-sectional view illustrating an MRAM device in accordance with further example embodiments;

FIG. 34 is a perspective view of portions of the MRAM device of FIG. 33;

FIGS. 35 to 38 are a plan view, cross-sectional views, and a perspective view of the MRAM device of FIG. 33, illustrating various stages of a method of manufacturing the MRAM device; and FIG. 39 is a block diagram illustrating a memory system in accordance with still further example embodiments.

DESCRIPTION OF EMBODIMENTS

Figure 1:
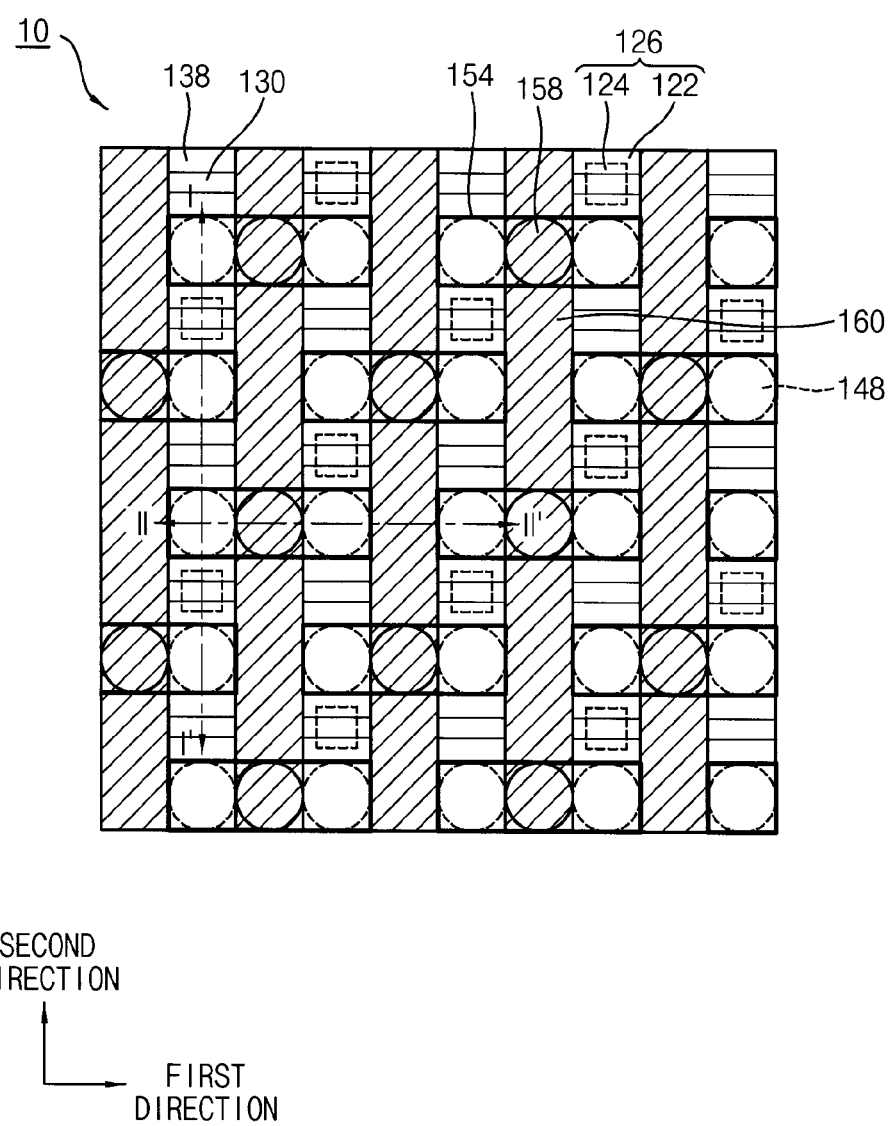

The principles of the inventive concepts will be described more fully hereinafter with reference to the accompanying drawings, in which various example embodiments are shown. The present inventive concepts may, however, be embodied in many different forms and should not be construed as being limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to," or "directly coupled to" another element or layer, there are no intervening elements or layers present. Like numerals refer to like elements throughout. As used herein, the term "and/or" includes any and all combinations of one or more of the associated listed items.

It will be understood that, although the terms "first," "second," "third," "fourth," etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a "first" element, component, region, layer, or section discussed below could be termed a "second" element, component, region, layer or section without departing from the teachings of the present inventive concept.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may also be otherwise oriented (e.g., rotated 90 degrees or at any other orientation) and the spatially relative descriptors used herein should be interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are further not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 2:
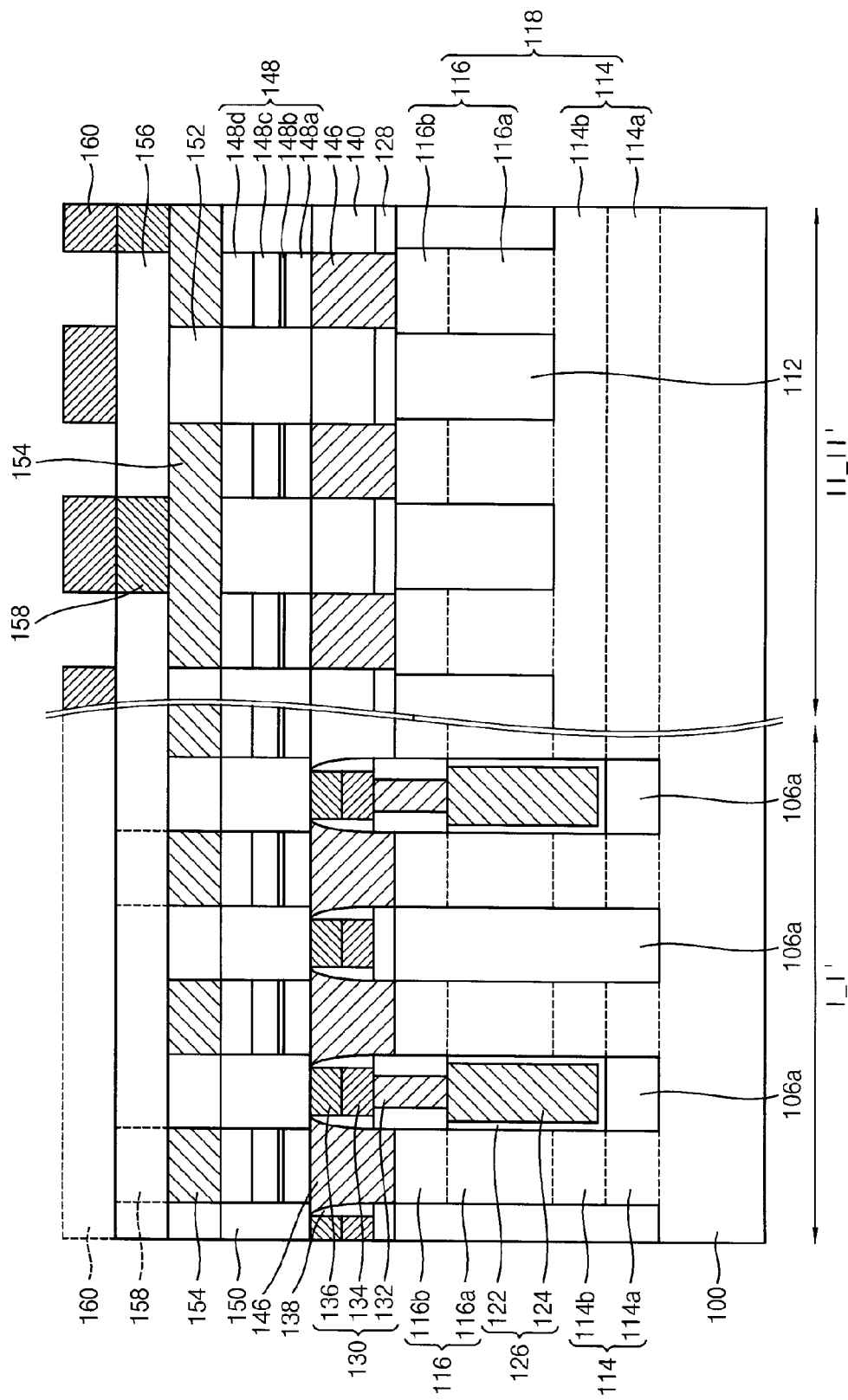

FIG. 1 is a plan view illustrating an MRAM device 10 in accordance with example embodiments. FIG. 2 is a cross-sectional view of the MRAM device 10 of FIG. 1. FIGS. 3, 4A, 4B and 4C are perspective views illustrating portions of the MRAM device 10 of FIG. 1.

Figure 3:
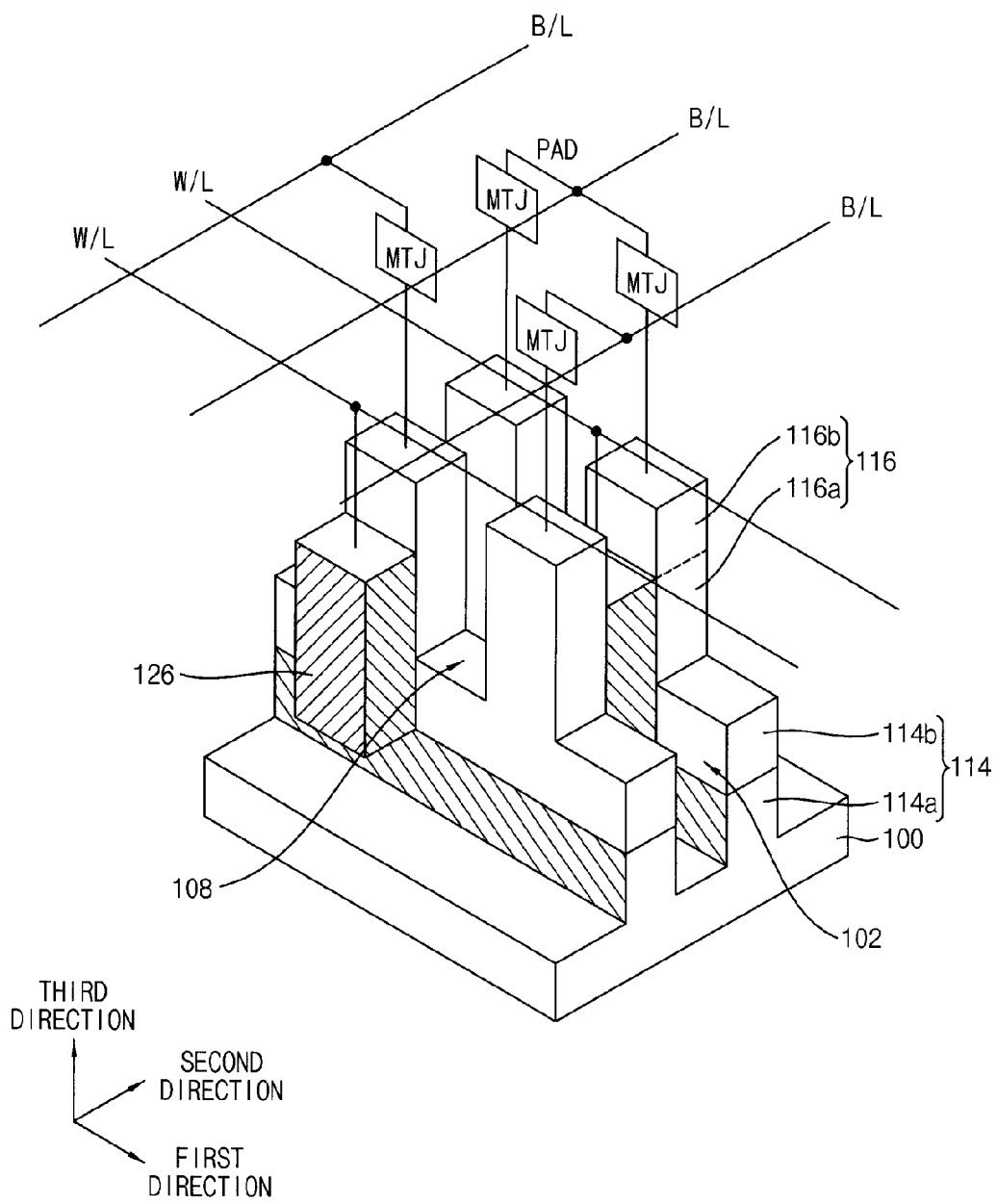
Figure 4A:
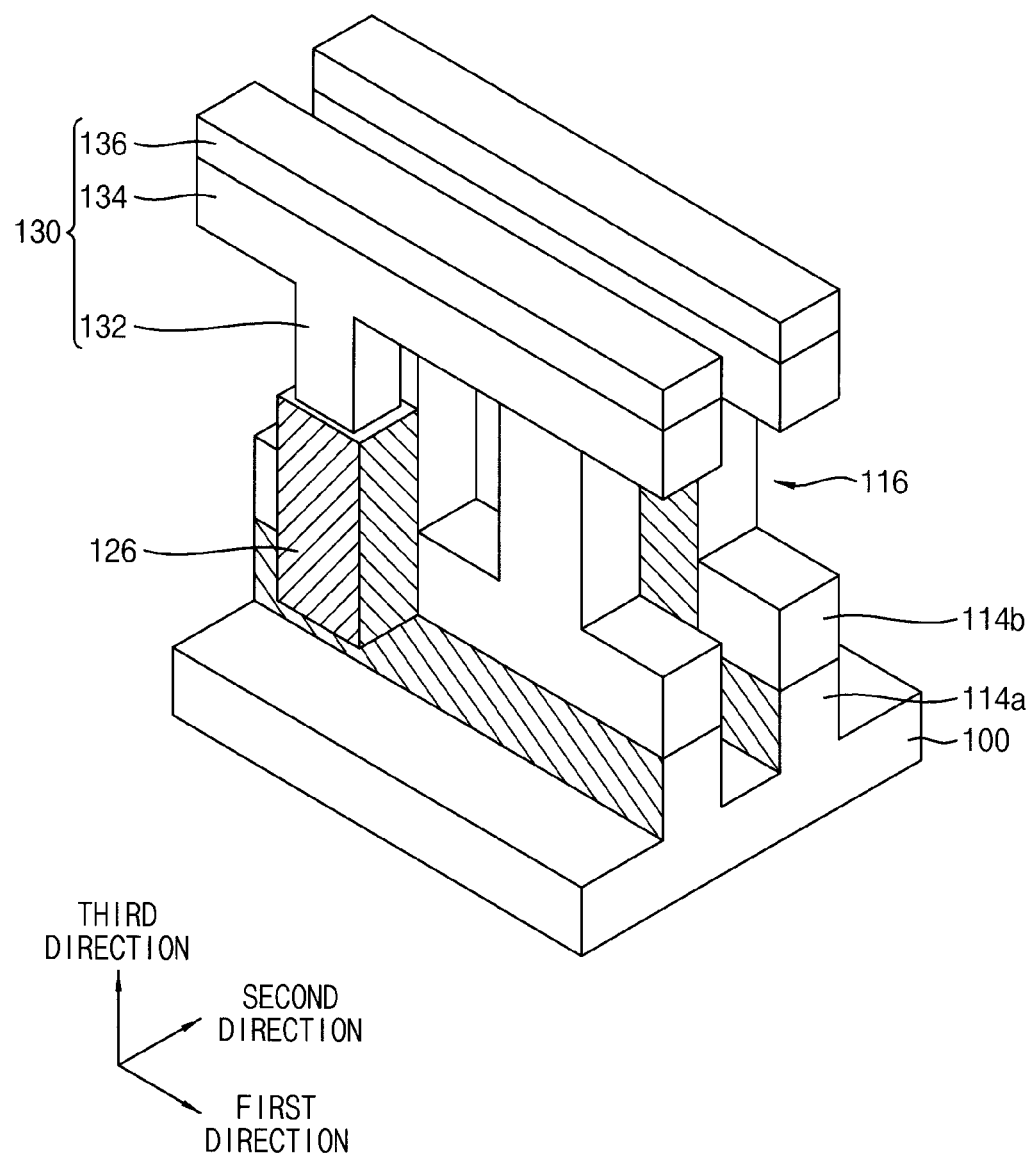
Figure 4B:
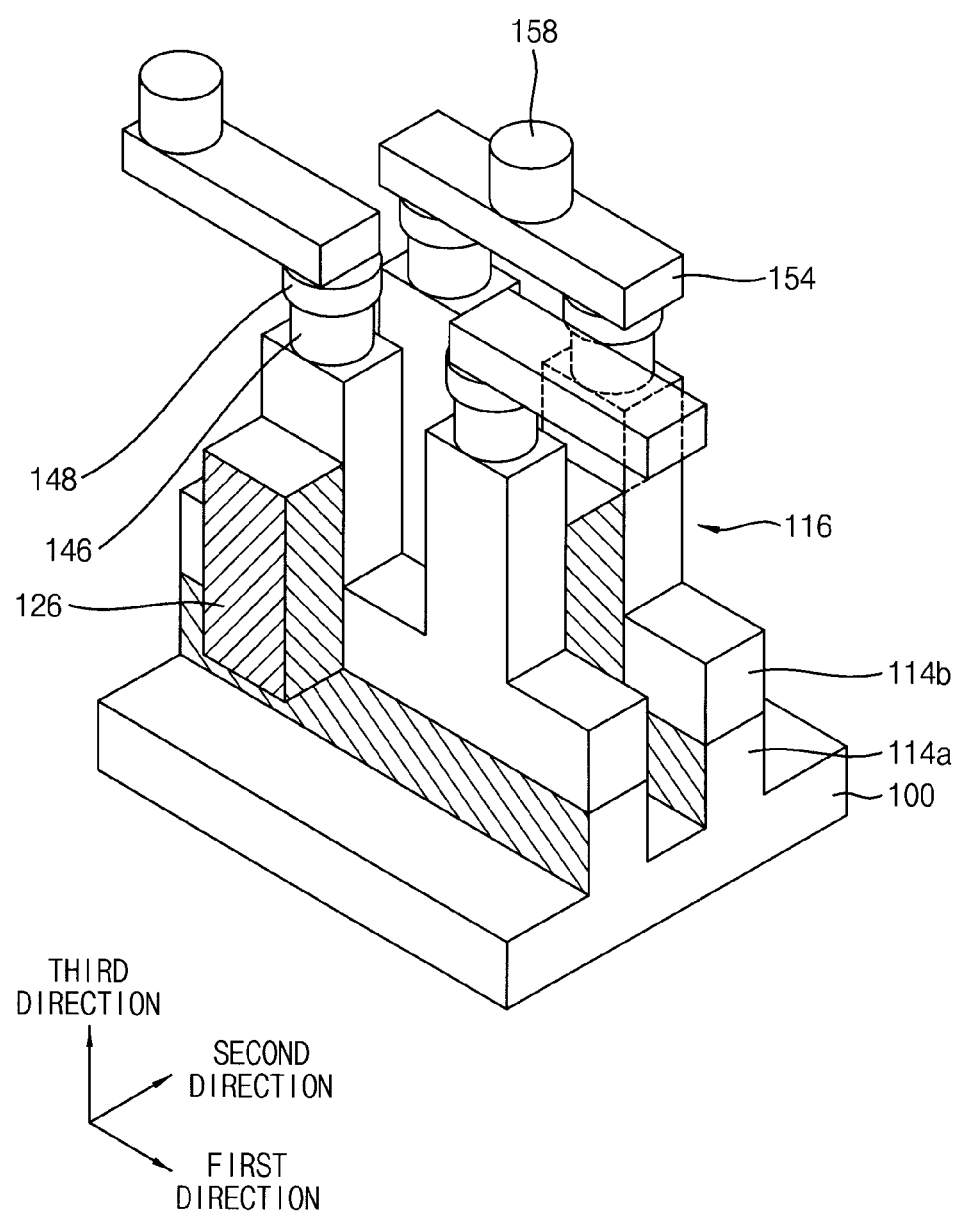
Figure 4C:
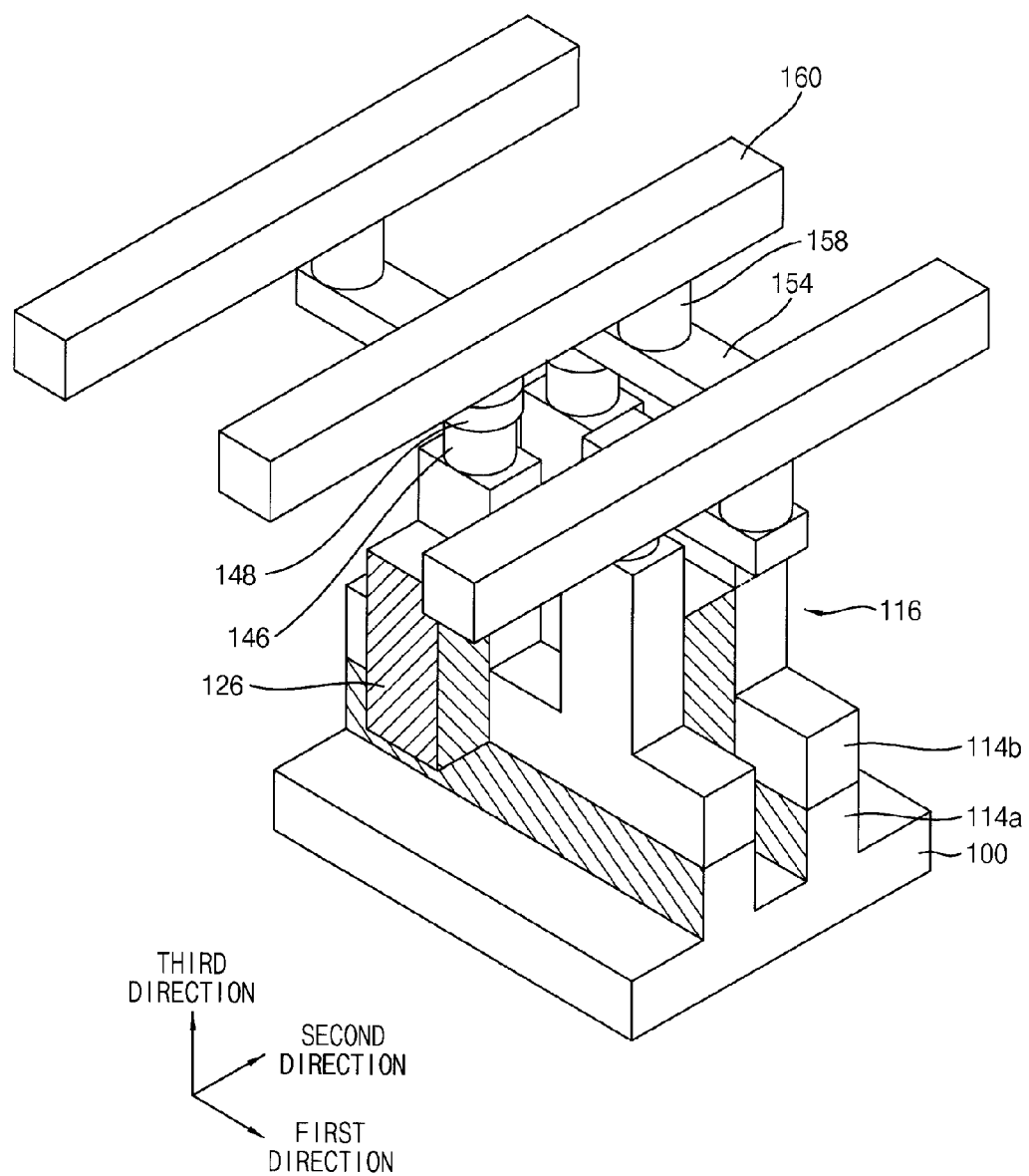

Particularly, FIG. 3 represents a connection of elements in the MRAM device 10. FIG. 4A represents a portion of a word line, FIG. 4B represents a portion of a magnetic tunnel junction (MTJ), and FIG. 4C represents a portion of a bit line. The word line is not shown in FIGS. 4B and FIG. 4C to facilitate easier viewing of other components and features.

Referring to FIGS. 1, 2, 3, 4A, 4B, and 4C, the MRAM device 10 may include a vertical channel transistor, a common source line 114a, a channel body region 114b, a word line structure 130, an MTJ structure 148, and a bit line 160.

A semiconductor structure 118 including a first semiconductor pattern 114 and a second semiconductor pattern 116 may be formed on a substrate 100.

In example embodiments, the semiconductor structure 118 may be formed by etching the substrate 100. Alternatively, the semiconductor structure 118 may be formed by an epitaxial growth process. The substrate 100 and the semiconductor structure 118 may include a semiconductor material, e.g., single crystal silicon, etc.

The first semiconductor pattern 114 may have a substantially linear shape extending in a first direction that is substantially parallel to a top surface of the substrate 100, and the second semiconductor pattern 116 may have a substantially pillar shape protruding in a third direction that is substantially perpendicular to the top surface of the substrate 100. In cross-section, the first and second semiconductor patterns 114 and 116 may have a comb-like shape. In example embodiments, a plurality of semiconductor structures 118 may be formed parallel to each other.

That is, a plurality of first semiconductor patterns 114 may be formed parallel to each other. A plurality of second semiconductor patterns 116 may be formed at regularly spaced-apart intervals on each of the first semiconductor patterns 114. The second semiconductor patterns 116 may be arranged linearly in the first direction and in a second direction that is substantially perpendicular to the first direction. Thus, the second semiconductor patterns 116 may be arranged in a grid-like shape.

Each of the first semiconductor patterns 114 may include an upper portion 114b and a lower portion 114a arranged in the third direction. The lower portion 114a of each of the first semiconductor patterns 114 may serve as a common source line (CSL) or common source region 114a, and the upper portion 114b of each of the first semiconductor patterns 114 may serve as a channel body region 114b.

The CSL 114a may be doped with impurities of a first conductivity type. In example embodiments, the CSL 114a may be doped with N+ type impurities. The CSL 114a may extend in the first direction. The CSL 114a may serve as a source region of each of transistors. Source regions of the transistors formed in the first direction may be electrically connected to each other by the CSL 114a.

The channel body region 114b may be doped with impurities of a second conductivity type that is different from the first conductivity type. In example embodiments, the channel body region 114b may be doped with P type impurities. The channel body region 114b may extend in the first direction.

Each of the second semiconductor patterns 116 may include an upper portion 116b and a lower portion 116a arranged in the third direction. The lower portion 116a of each of the second semiconductor patterns 116 may serve as a channel region 116a of the transistor, and the upper portion 116b of each of the first semiconductor patterns 116 may serve as a drain region 116b of the transistor. Thus, one transistor may be formed on each of the second semiconductor patterns 116.

The channel region 116a may be doped with impurities of the second conductivity type, which may be the same as that of the channel body region 114b. The drain region 116b may be doped with impurities of the first conductivity type, which may be the same as that of the CSL 114a.

Lower portions of channel regions 116a of the transistors formed in the first direction may be electrically connected to each other by the channel body region 114b. The channel body region 114b may provide a path for discharging accumulated charges in the channel regions 116a. Thus, the channel regions 116a may thereby be prevented from floating due to the accumulated charges.

The semiconductor structures 118 may include a first trench 102 and a second trench 108 arranged therein. The first trench 102 may be formed between the first semiconductor patterns 114, and the second trench 108 may be formed between the second semiconductor patterns 116.

The first trench 102 may extend in the first direction. The first trench 102 may have a first depth measured from an upper surface of the semiconductor structure 118. A top surface of the first semiconductor pattern 114 may be substantially coplanar with a bottom of the second trench 108. A plurality of second trenches 108 may be regularly arranged in the first direction. Each of the second trenches 108 may have a second depth measured from the upper surface of the semiconductor structure 118 that is less than the first depth.

A gate structure 126 may be formed in the first trench 102. The gate structure 126 may include a gate insulation layer 122 and a gate electrode 124. The gate structure 126 may have a pillar shape. The gate structure 126 may be disposed between second semiconductor patterns 116 adjacent to each other in the second direction. Thus, the gate structure 126 may serve as a common gate of two transistors formed on the adjacent second semiconductor patterns 116.

First and second insulation patterns 106a and 112, respectively, may be formed between the semiconductor structure 118 and the gate structure 126. The first and second insulation patterns 106a and 112, respectively, may include, e.g., silicon oxide.

The gate insulation layer 122 may include a first portion and a second portion. The first portion may be formed on sidewalls of the semiconductor structures 118 facing each other in the second direction, and the second portion may be formed on the first insulation pattern 106a between the semiconductor structures 118. The gate insulation layer 122 may include silicon oxide. The gate electrode 124 may be formed on the gate insulation layer 122, and may have a pillar shape. The gate electrode 124 may, for example, include, polysilicon or a metal. The gate insulation layer 122 may have a cup shape surrounding a sidewall and a bottom surface of the gate electrode 124.

The bottom surface of the gate structure 126 may be substantially coplanar with, or lower than, a top surface of the common source line 114a. The gate structure 126 may abut the channel region 116a, and extend to the channel body region 114b thereunder. Thus, when a voltage greater than a threshold voltage is applied to the gate electrode 124, a vertical channel may be formed at the channel region 116a and the channel body region 114b, so that the transistor may be turned on.

The gate structure 126 may be formed between channel regions 116a included in two second semiconductor patterns 116 adjacent to each other in the second direction, and between the channel body regions 114a arranged thereunder. Thus, when the gate structure 126 is operated, the two adjacent transistors may be turned on.

In example embodiments, a plurality of gate structures 126 abutting the second semiconductor patterns 116 may be arranged in the first and second directions. However, the gate structures 126 may not abut all of the second semiconductor patterns 116 along each of the first trenches 102, but may abut only some of the second semiconductor patterns 116. For example, one gate structure 126 may be provided for every two second semiconductor patterns 116 in the first direction. Thus, viewed in plan view, the gate structures 126 may be disposed in a zigzag fashion in the first direction.

In example embodiments, along each of odd-numbered first trenches 102 arranged in the second direction, second semiconductor patterns 116 abutting the gate structures 126 and second semiconductor patterns 116 not abutting the gate structures 126 may be alternately disposed. Also, along each of even-numbered first trenches 102 arranged in the second direction, second semiconductor patterns 116 not abutting the gate structures 126 and second semiconductor patterns 116 abutting the gate structures 126 may be alternately disposed.

As described above, each of the gate structures 126 may serve as the common gate of two adjacent transistors. Thus, the number of gate structures 126 may be reduced, and a distance between the gate structures 126 may be increased. Thus, the gate structures 126 may be formed easily.

Referring to FIG. 4A, the word line structure 130 may be formed on the gate structures 126, and may extend in the first direction. Thus, the gate structures 126 disposed sequentially in the first direction may be electrically connected to each other by the word line structure 130.

In example embodiments, the word line structure 130 may include word line contact plugs 132, a word line 134, and a hard mask 136. The word line contact plugs 132 may each contact a respective one of the gate structures 126. The word line 134 may be electrically connected to each of the word line contact plugs 132 arranged in a line in the first direction. The hard mask 136 may be formed on the word line 134. The word line 134 and the hard mask 136 may each extend in the first direction. The word line 134 and the hard mask 136 may be formed under a portion between the MTJ structures 148.

Spacers 138 (see FIG. 2) may be formed on sidewalls of the word line structure 130 such that the word line 134 may be covered by the hard mask 136 on top and the spacers 138 on the sides.

The word line contact plugs 132 and the word line 134 may, for instance, include doped polysilicon or a metal. The hard mask 136 and the spacers 138 may, for example, include silicon nitride.

Alternatively, in the word line structure 130, the word line 134 may directly contact the gate structures 126 and the hard mask 136, and the word line contact plugs 132 may be omitted.

A top surface of the word line structure 130 may be higher than that of the second semiconductor pattern 126. Also, the word line structure 130 may be arranged so as not to contact the second semiconductor pattern 126.

When an electrical signal is applied to the word line 134, the electrical signal may be transferred to each of the gate structures 126 that may be arranged along and connected to that word line 134 in the first direction. Also, the transistors abutting the gate structures 126 in the second direction may be turned on by the electrical signal.

Referring now to FIG. 4B, a contact plug 146 and the MTJ structure 148 may be formed on each of the second semiconductor patterns 116.

Each contact plug 146 may be formed between and connected to a corresponding drain region 116b and MTJ structure 148. Each MTJ structure 148 may serve as a data storage element of a corresponding memory cell. Thus, the memory cells may each include an MTJ structure 148.

A second semiconductor pattern 116, a contact plug 146, and an MTJ structure 148 may be sequentially arranged or stacked in the third direction.

Referring again to FIG. 2, in example embodiments, the MTJ structure 148 may include a fixed layer structure 148a, a tunnel barrier layer pattern 148b, a free layer pattern 148c, and an upper electrode 148d that are sequentially stacked.

In example embodiments, the fixed layer structure 148a may include a pinning layer, a lower ferromagnetic layer, an anti-ferromagnetic coupling spacer layer and an upper ferromagnetic layer. The pinning layer may, for example, include: FeMn, IrMn, PtMn, MnO, MnS, MnTe, $MnF_2$, $FeF_2$, $FeCl_2$, FeO, $CoCl_2$, CoO, $NiCl_2$, NiO, Cr, etc. The lower and upper ferromagnetic layers may, for instance, include Fe, Ni, Co, etc. The anti-ferromagnetic coupling spacer layer may, for example, include Ru, Ir, Rh, etc.

The tunnel barrier layer 148b may, for instance, include aluminum oxide or magnesium oxide.

The free layer 148c may, for example, include a ferromagnetic material containing Fe, Ni, Co, etc.

The MTJ structure 148, however, is not limited to the above structure or composition, and various modifications are within the contemplation of the principles of the inventive concepts.

Furthermore, the data storage element may alternatively include a variable resistance structure or other memory structure instead of the MTJ structure 148.

A pad pattern 154 may be formed on two adjacent MTJ structures 148, and the MTJ structures 148 may be electrically connected to each other via the pad pattern 154. The pad pattern 154 may therefore connect two MTJ structures 148 neighboring each other in the first direction.

Viewed in plan view, the gate structures 126 may be disposed in a zigzag fashion in the first direction, so that the two transistors connected to a single pad pattern 154 may be independently operated by different gate structures 126. In example embodiments, a first transistor under a first MTJ structure of the two MTJ structures 148 connected to a single pad pattern 154 may include one of the gate structures 126 abutting a front side of the second semiconductor pattern 116 in the second direction. Also, a second transistor under a second MTJ structure of the two MTJ structures 148 connected to the pad pattern 154 may include another of the gate structures 126 abutting a rearward side of the second semiconductor pattern 116 in the second direction.

First ones of the pad patterns 154 on the semiconductor structures 118 in an odd-numbered column arranged in the second direction may be shifted in the first direction from second ones of the pad patterns 154 on the semiconductor structures 118 in an even-numbered column A gap may be arranged between the first pad patterns on the semiconductor structures 118 in the odd-numbered column and a center portion of the second pad patterns on the semiconductor structures 118 in the even-numbered column. Thus, the pad patterns 154 may be disposed in a zigzag fashion in the first direction when viewed in plan view.

An upper contact 158 may be formed on each of the pad patterns 154, respectively. In example embodiments, each of the upper contacts 158 may be formed on a center portion of a corresponding one of the pad patterns 154. Also, the upper contacts 158 may be disposed in a zigzag fashion in the first direction when viewed in plan view.

Referring to FIG. 4C, the bit line 160 may contact the upper contacts 158, and may extend in the second direction. Each bit line 160 may be electrically connected to either the MTJ structures 148 in odd-numbered columns or the MTJ structures 148 in even-numbered columns.

When an electrical signal is applied to the bit line 160, the electrical signal may be transferred to the MTJ structures 148 of the memory cells connected to the bit line 160. That is, the electrical signal may be applied to the MTJ structures 148 via the pad patterns 154 contacting the bit line 160. Alternate ones of the MTJ structures 148 arranged in the second direction may be selected by one of the bit lines 160, and an additional adjacent one of the MTJ structures 148 in the first direction may be simultaneously selected.

In the MRAM device having the above-described layout, the common source line 114a, the channel body region 114b, the gate structure 126, the word line structure 130, and the bit line 160 may be used in common for a plurality of memory cells. More specifically, a common source line 114a and channel body region 114b may be used in common for multiple memory cells arranged in the first direction. A gate structure 126 may be used in common for two memory cells adjacent to each other in the second direction. A word line structure 130 may be used in common for multiple memory cells arranged in the first direction. A bit line 160 may be used in common for multiple alternating memory cells arranged in the second direction and located adjacent to each other in the second direction.

In the MRAM device, memory cells sharing the gate structure 126 may be connected to different bit lines 160, and memory cells sharing a word line structure 130 may be connected to different bit lines 160. Thus, one memory cell may be selected by the word line structure 130 and the bit lines 160.

As described above, in the MRAM device, memory cells may share the word line structure 130 and the bit lines 160. Thus, a size of the memory cell structures may be reduced, and the MRAM device may be more highly integrated. Also, the MRAM device may include the channel body region 114b, so that the channel region 116a may be substantially prevented from floating due to charge storage therein. Thus, the MRAM device may have good electrical characteristics.

Figure 5:
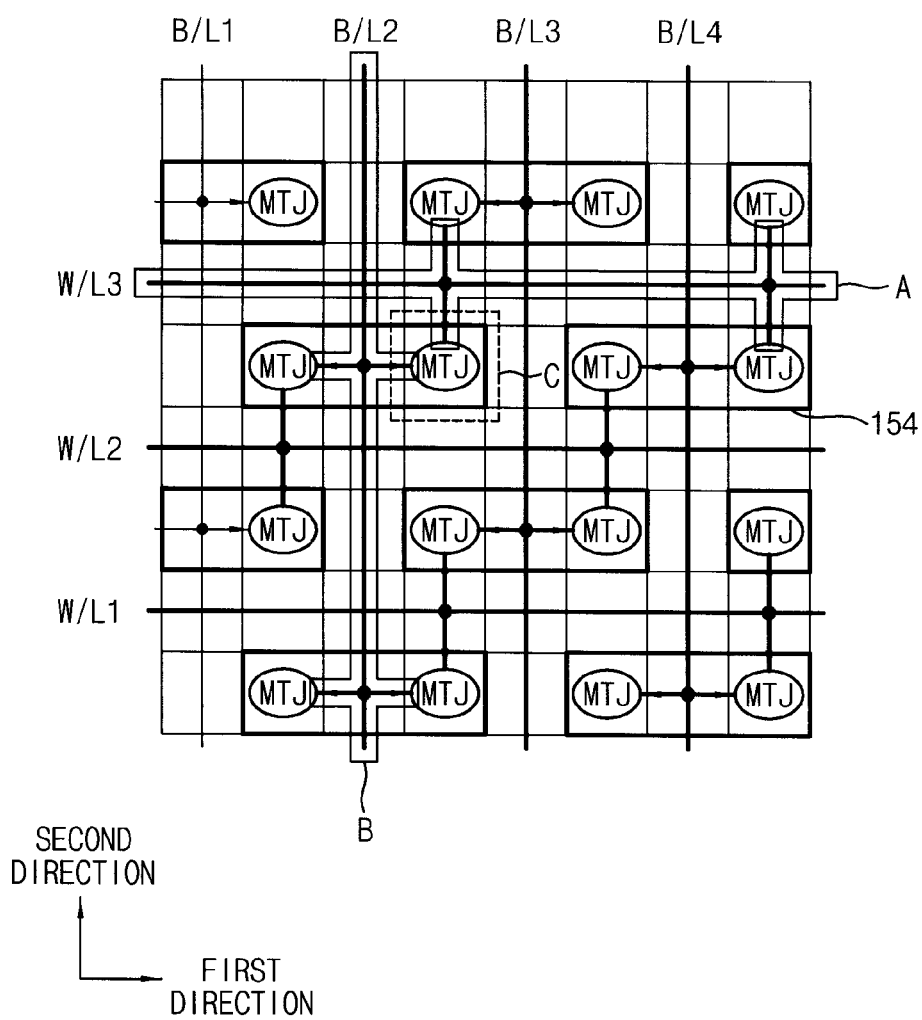

FIG. 5 is a block diagram illustrating a process of selecting memory cells in accordance with example embodiments.

Hereinafter, a method of selecting a memory cell of a region C using a word line and a bit line will be described.

Referring to FIG. 5, a third word line W/L3 in a third row may be selected, and thus memory cells of a region A may be selected. That is, an electrical signal may be applied to gate electrodes arranged in the first direction along the third word line W/L3, so that alternate ones of the first memory cells arranged in the first direction may be selected. Also, second memory cells arranged adjacent to each of the selected first memory cells in the second direction may be simultaneously selected, and the first and second selected memory cells may share a common gate electrode.

Further, a second bit line B/L2 in a second column may be selected, and thus memory cells of a region B may be selected. That is, an electrical signal may be applied to alternate ones of the pad patterns 154 arranged in the second direction along the second bit line B/L2, so that alternate ones of the third memory cells may be selected. Also, fourth memory cells adjacent to each of the selected third memory cells and connected to the pad patterns 154 may be selected together with the selected third memory cells.

Thus, a single memory cell in the region C, arranged near an intersection of the third word line W/L3 and the second bit line B/L2 may be selected.

FIGS. 6 to 20 are cross-sectional views, perspective views, and plan views, respectively, illustrating the MRAM device of FIG. 1 during various stages of a method of manufacture.

Figure 8:
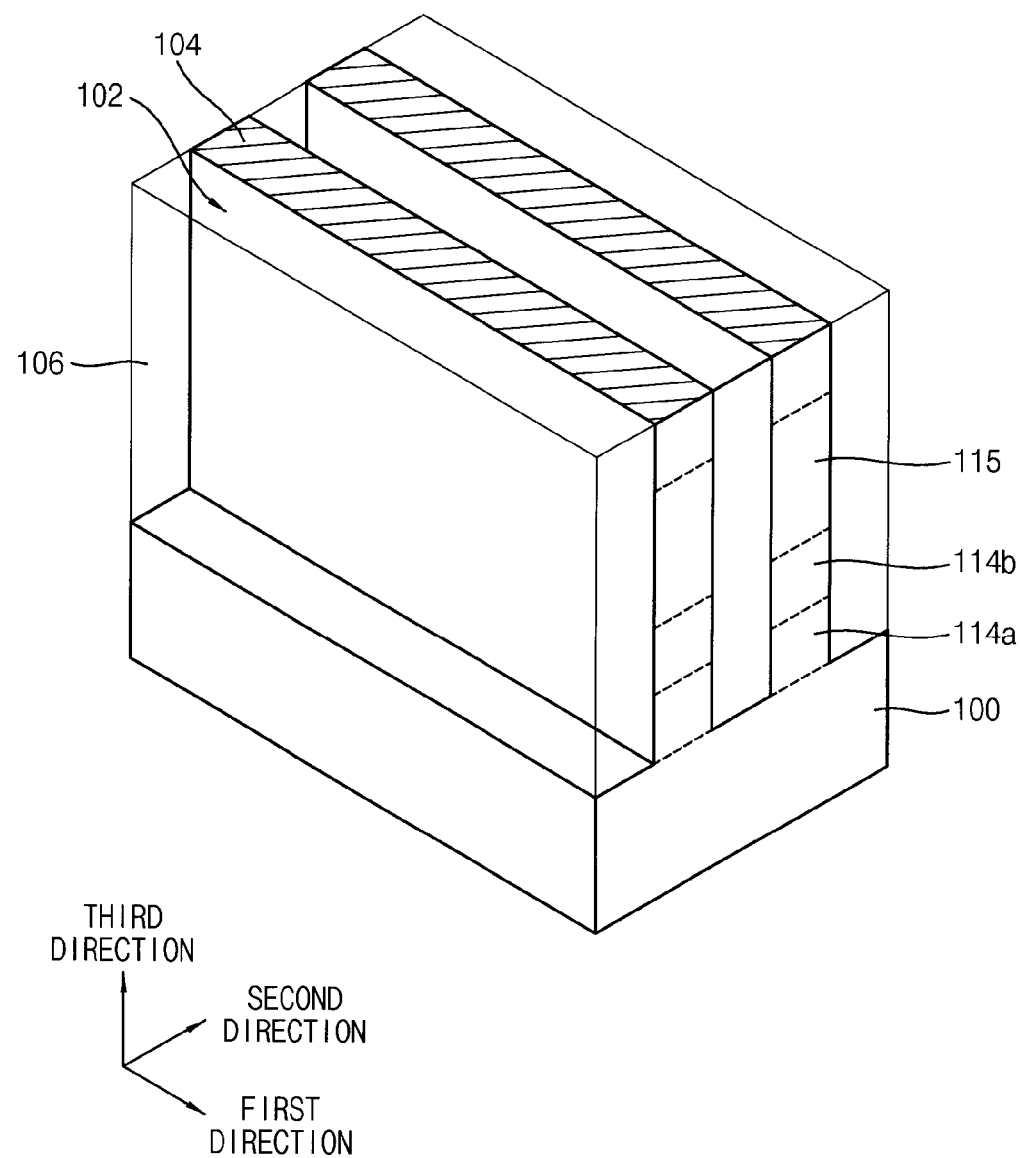
Figure 11:
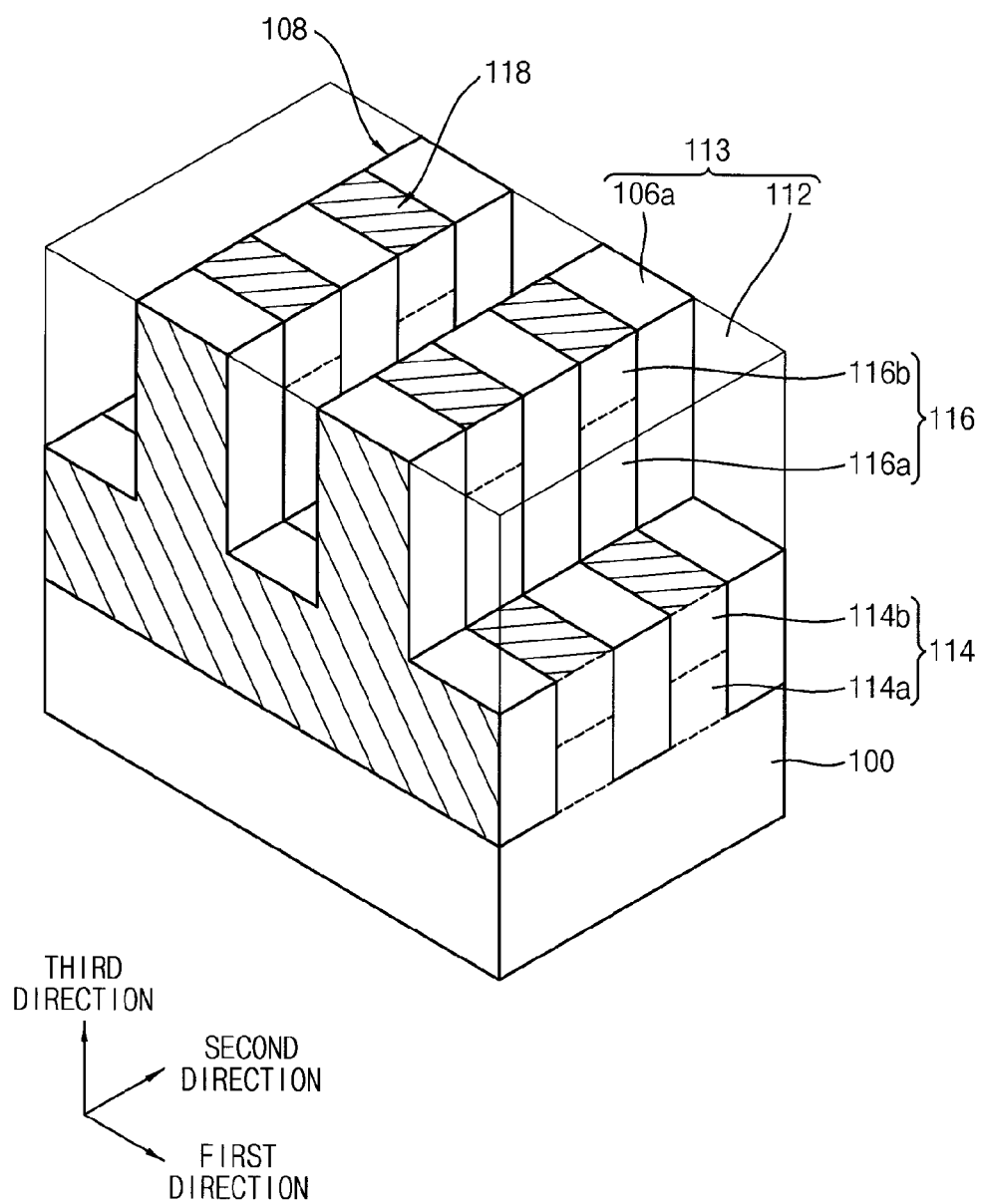

More particularly, FIGS. 6, 7, 9, 10, 13, 15, 17, 19, 21, 23, 25, 27, and 29 are plan views, FIGS. 8 and 11 are perspective views, and FIGS. 12, 14, 16, 18, 20, 22, 24, 26, 28, and 30 are cross-sectional views.

Figure 28:
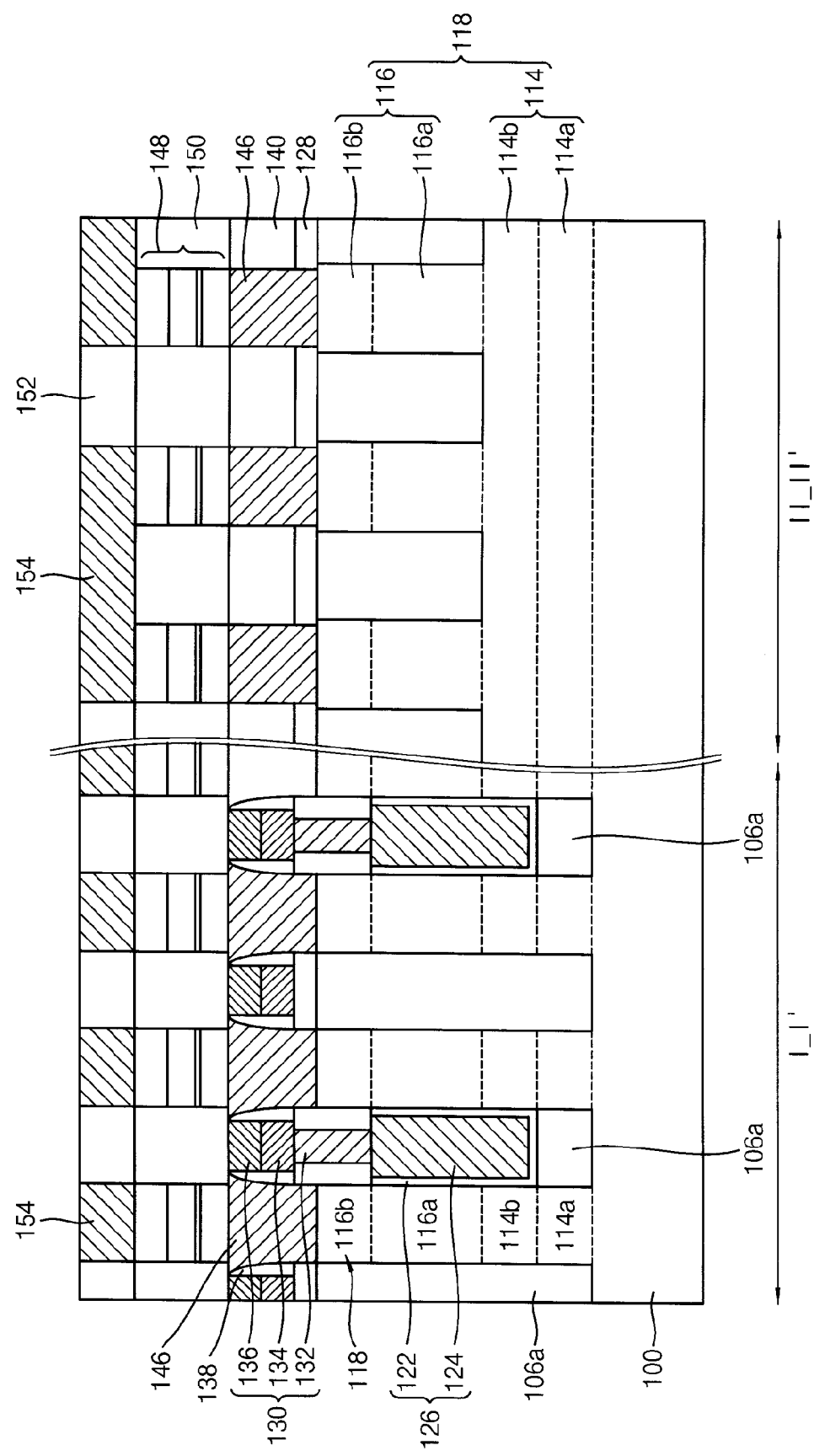
Figure 30:
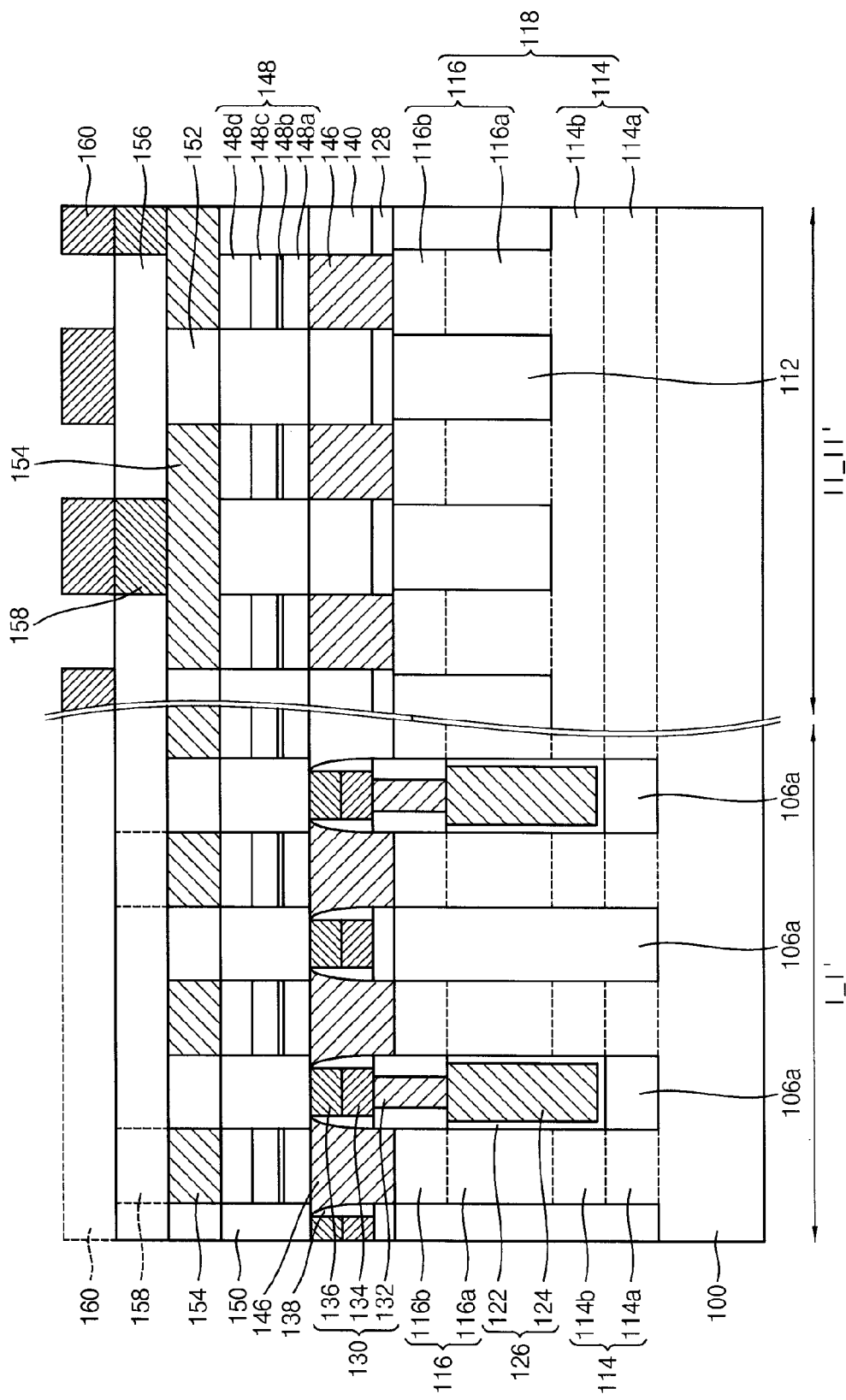

FIGS. 12, 14, 16, 18, 20, 22, 24, and 26 are cross-sectional views taken along a line I-I' of FIGS. 10, 13, 15, 17, 19, 21, 23 and 25, respectively, and FIGS. 28 and 30 each include cross-sectional views taken along lines I-I' and II-II' of FIGS. 27 and 29, respectively.

Figure 6:
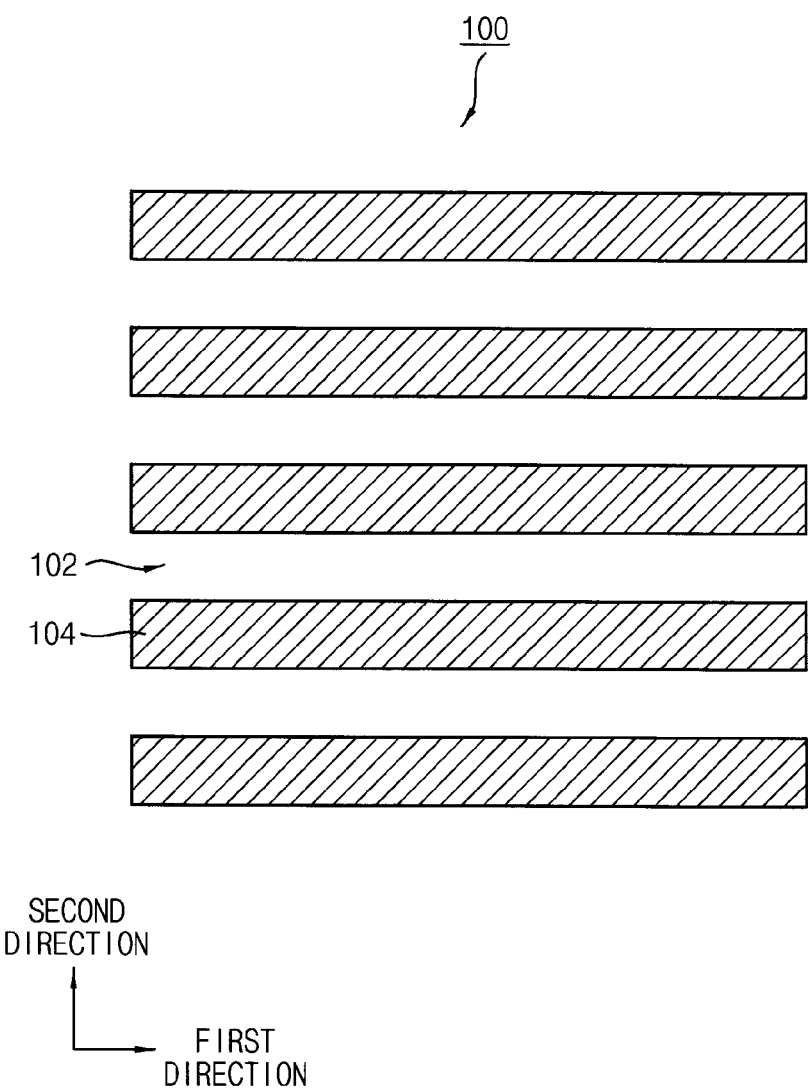

Referring to FIG. 6, a first etching mask (not shown) extending in a first direction may be formed on a substrate 100. The substrate 100 may be anisotropically etched using the first etching mask to form a first trench 102 having a first depth. The substrate 100 may be formed, for instance, to include single crystalline silicon.

In example embodiments, a plurality of first trenches 102, each extending in the first direction, may be formed. A preliminary semiconductor pattern 104 may be formed between the first trenches 102. In example embodiments, a plurality of preliminary semiconductor patterns 104, each extending in the first direction, may be formed spaced apart from each other.

In example embodiments, the substrate 100 may be doped with first impurities to form a common source line (not shown), and/or may be doped with second impurities to form a channel body region (not shown) and a preliminary channel region (not shown), before or after forming the first trenches 102.

As shown in FIG. 8, a common source line 114a may be formed at a lower portion of each of the preliminary semiconductor patterns 104. A channel body region 114b and preliminary channel region 115 may be formed at an upper portion of each of the preliminary semiconductor patterns 104 on the common source line 114a. However, the order of performing the doping process is not limited to that described above.

Referring to FIGS. 7 and 8, a first preliminary insulation pattern 106 may be formed in each of the first trenches 102 between the preliminary semiconductor patterns 104. The first preliminary insulation pattern 106 may, for example, include silicon oxide.

More specifically, a first insulation layer may be formed to fill the first trenches 102 between the preliminary semiconductor patterns 104. The first insulation layer may be planarized until top surfaces of the preliminary semiconductor patterns 104 are exposed to form the first preliminary insulation pattern 106 in each of the first trenches 102.

Referring to FIG. 9, a second etching mask (not shown) may be formed extending in a second direction that is substantially perpendicular to the first direction on the preliminary semiconductor patterns 104 and the first preliminary insulation patterns 106. The preliminary semiconductor patterns 104 and the first preliminary insulation patterns 106 may be anisotropically etched using the second etching mask to form a plurality of second trenches 108. Each of the second trenches 108 may extend in the second direction and have a second depth that is less than the first depth. Thus, a semiconductor structure 118 and a first insulation pattern 106a may be formed on the substrate 100.

As shown in FIG. 11, the semiconductor structure 118 may include a first semiconductor pattern 114 extending in the first direction, and a second semiconductor pattern 116 having a pillar shape protruding from the first semiconductor pattern 114. That is, the second semiconductor pattern 116 may be formed between the second trenches 108, and the first semiconductor pattern 114 may be formed below the second trenches 108.

In example embodiments, a plurality of second semiconductor patterns 116 may be formed to be arranged in a grid shape, with lines of second semiconductor patterns 116 extending in both the first and second directions.

Figure 12:
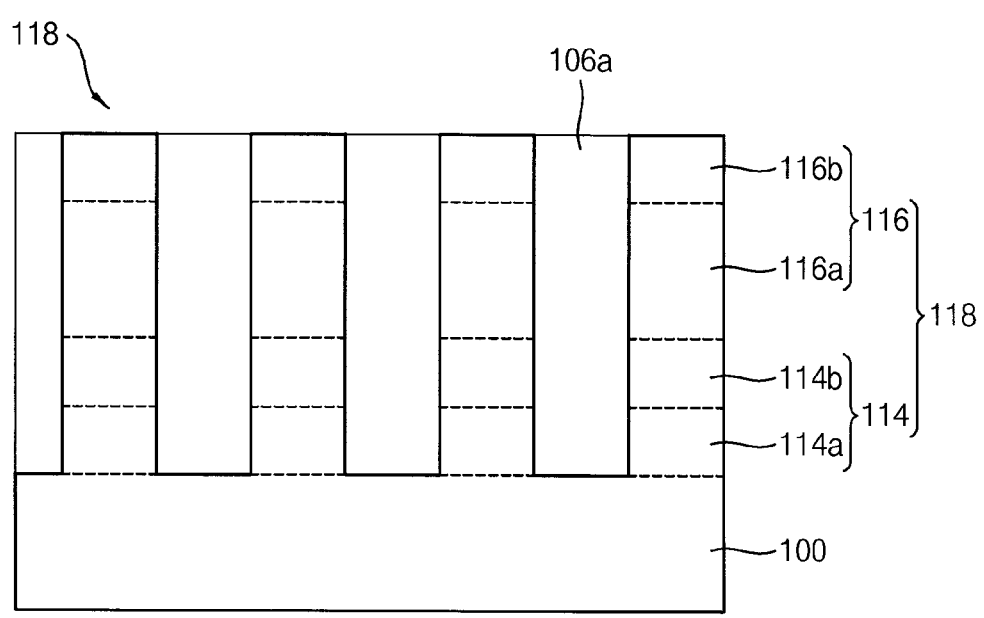

Referring to FIGS. 10, 11, and 12, a second insulation layer may be formed to fill each of the second trenches 108. The second insulation layer may then be planarized to form a second insulation pattern 112. The planarization process may be performed until top surfaces of the second semiconductor patterns 116 are exposed. The second insulation pattern 112 may be formed to include a material substantially the same as that of the first insulation pattern 106a, e.g., silicon oxide.

Thus, the first and second insulation patterns 106a and 112, respectively, may be formed between the semiconductor structures 118. The first and second insulation patterns 106a and 112, respectively, may be merged, and the merged layer may be referred to simply as an insulation layer pattern 113.

The semiconductor structure 118 may be doped with the first impurities to form a drain region 116b. Alternatively, the drain region 116b may be formed previously.

Figure 14:
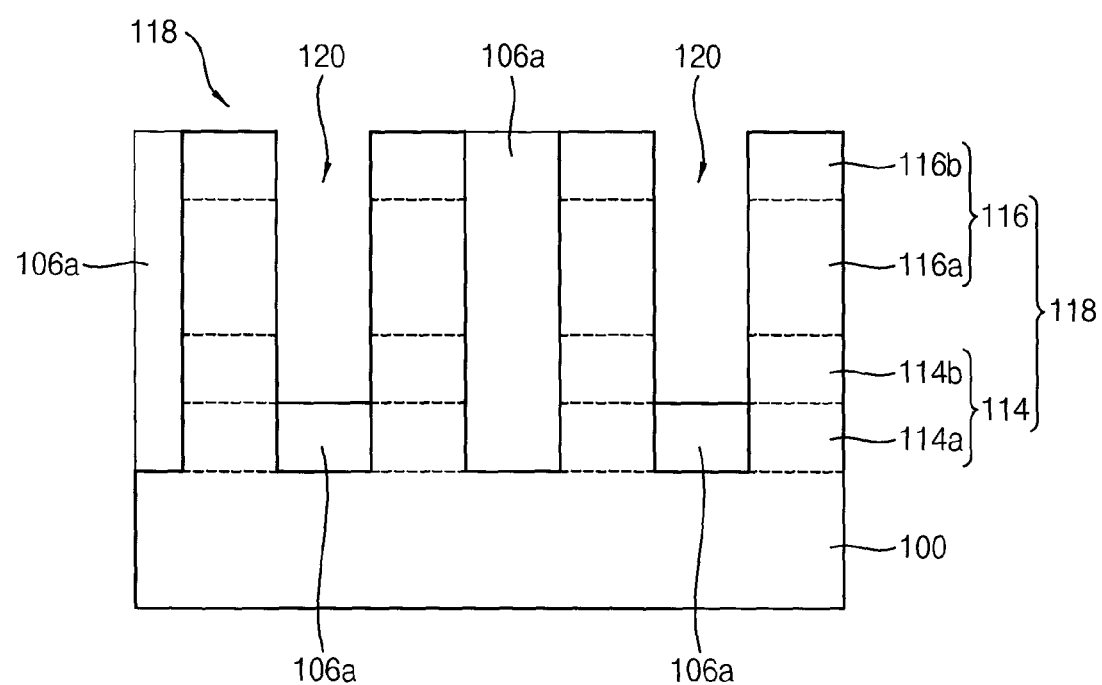

Referring to FIGS. 13 and 14, a third etching mask (not shown) may be formed, exposing portions of the semiconductor structure 118 and the insulation layer pattern 113 at which gate structures may be subsequently formed. The first insulation pattern 106a may be partially etched using the third etching mask to form third trenches 120. The gate structures may be subsequently formed in respective ones of the third trenches 120.

Third trenches 120 may be formed between the plurality of semiconductor structures 118. The drain region 116b and the channel region 116a of the second semiconductor patterns 116 and the channel body region 114b of the first semiconductor pattern 114, arranged under the channel region 116a, may be exposed to a sidewall of each of the third trenches 120. Two second semiconductor patterns 116 adjacent to each other in the second direction may be exposed to the sidewall of a corresponding one of the third trenches 120.

A bottom of each of the third trenches 120 may be substantially coplanar with, or lower than, a top surface of the common source line 114a. More specifically, the bottom of each of the third trenches 102 may be substantially coplanar with, or lower than, a bottom surface of the channel body region 114b, and higher than a bottom surface of the common source line 114a.

The third trenches 120 may be formed to expose alternating ones of the second semiconductor patterns 116 in the first direction. Thus, viewed in plan view, the third trenches 120 may be disposed in a zigzag fashion in the first direction.

Figure 16:
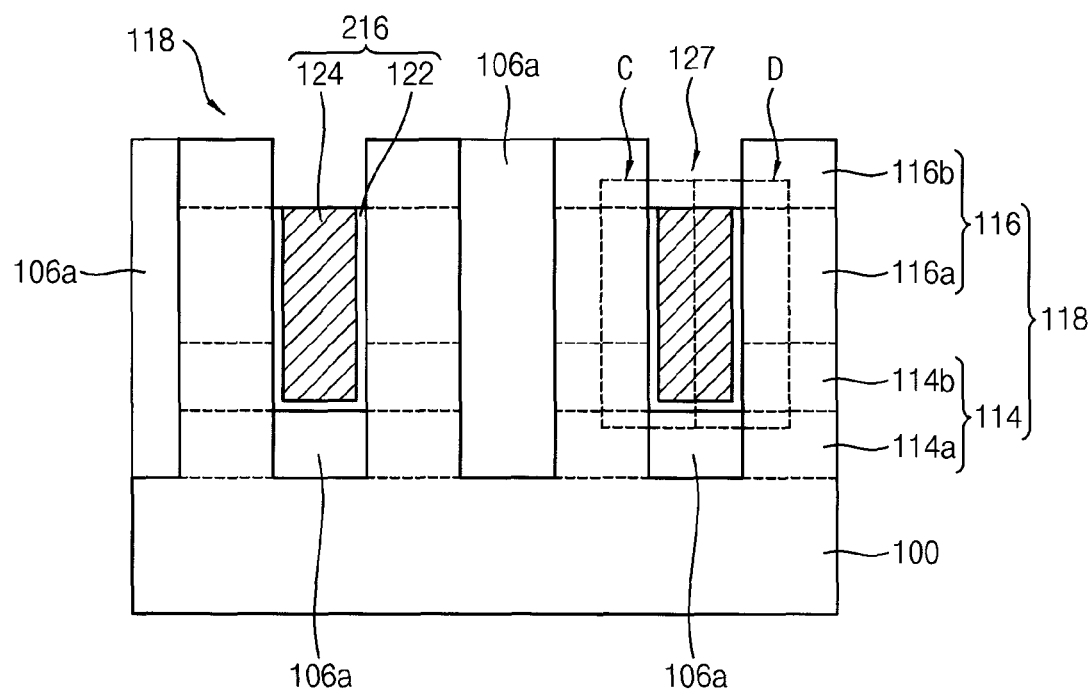

Referring to FIGS. 15 and 16, a preliminary gate insulation layer may be conformally formed on a sidewall and a bottom of each of the third trenches 120. A gate electrode layer may be formed on the preliminary gate insulation layer to fill each of the third trenches 120.

The preliminary gate insulation layer may be formed to include silicon oxide, for example. A thickness of the preliminary gate insulation layer may be controlled in accordance with the desired electrical characteristics of a transistor. The preliminary gate insulation layer may be formed to have a thickness leaving a space for forming the gate electrode layer in each of the third trenches 120. The gate electrode layer may be formed to include polysilicon or a metal, for example.

The gate electrode layer and the preliminary gate insulation layer may be planarized until a top surface of the first insulation pattern 106a is exposed. In example embodiments, the planarization process may be performed using a chemical mechanical polishing (CMP) process and/or an etch back process. Upper portions of the gate electrode layer and the preliminary gate insulation layer may be partially etched to form a recess 127, and the gate electrode layer and the preliminary gate insulation layer may be transformed into a gate electrode 124 and a gate insulation layer 122, respectively. Thus, a top surface of the gate electrode 124 may be lower than that of the second semiconductor patterns 116, and the drain region 116b may be exposed to a sidewall of the recess 127.

As described above, a gate structure 126, including the gate electrode 124 and the gate insulation layer 122, may be formed in each of the third trenches 120. The gate structure 126 may be formed between two adjacent semiconductor patterns 116, so that the gate structure 126 may serve as a common gate of two adjacent transistors (see FIG. 16, region C).

Figure 18:
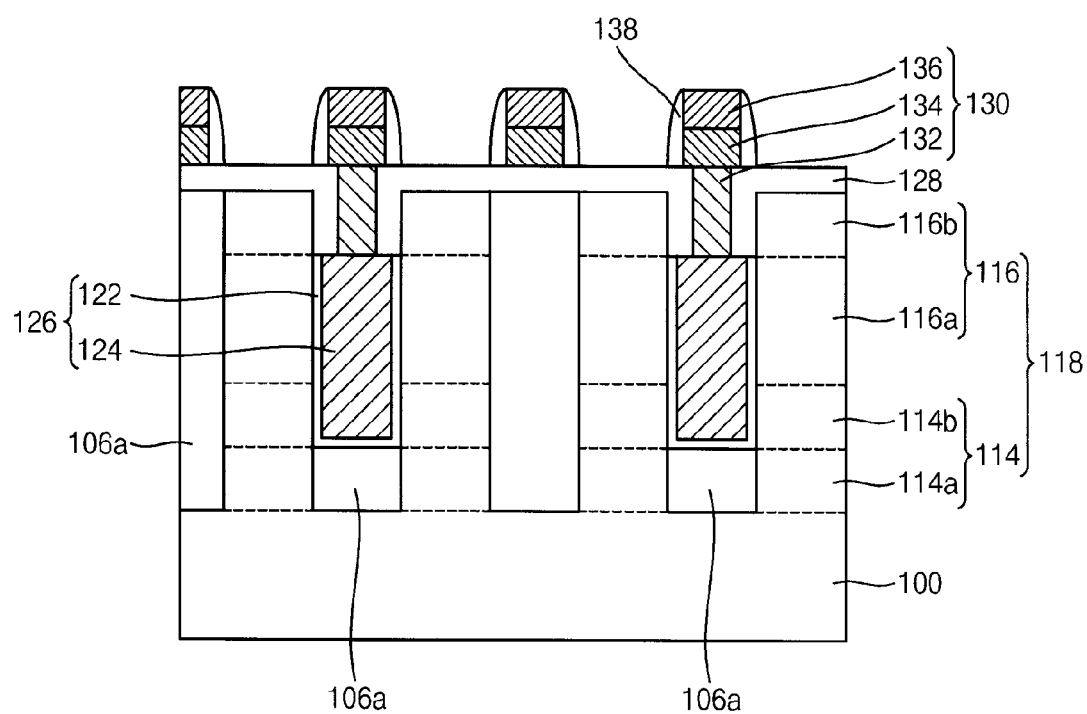

Referring to FIGS. 17 and 18, a first insulating interlayer 128 may be formed on the first and second semiconductor patterns 106a and 116, respectively, and the gate electrode structure 126 to fill the recess 127. The first insulating interlayer 128 may be partially etched to form contact holes therethrough, which expose a top surface of the gate electrode 124.

A word line structure 130 may be formed to contact the gate electrode 124 and to extend in the first direction. The word line structure 130 may be formed between the second semiconductor patterns 116. The word line structure 130 may be formed to include word line contact plugs 132, a word line 134, and a hard mask 136. Each of the word line contact plugs 132 may contact the gate electrode 124 through a corresponding one of the contact holes. The word line 134 may be formed to contact the word line contact plugs 132 and to extend in the first direction.

More specifically, a conductive layer may be formed on the first insulating interlayer 128 to fill the contact holes. The conductive layer may include a metal such as tungsten. The hard mask 136 may be formed on the conductive layer extending in the first direction. The hard mask 136 may include silicon nitride, for example. The conductive layer may be etched using the hard mask 136 as an etching mask to form the word line contact plugs 132 and the word line 134.

A spacer layer may be formed on the first insulating interlayer 128 to cover the word line structure 130, and the spacer layer may be anisotropically etched to form spacers 138 on sidewalls of the word line structure 130. The spacers 138 may include an insulating material such as silicon nitride. The hard mask 136 and the spacers 138 may thereby protect the word line 134. Contact plugs 146 (see FIGS. 23 and 24) may be subsequently formed in a space between the spacers 138.

Figure 20:
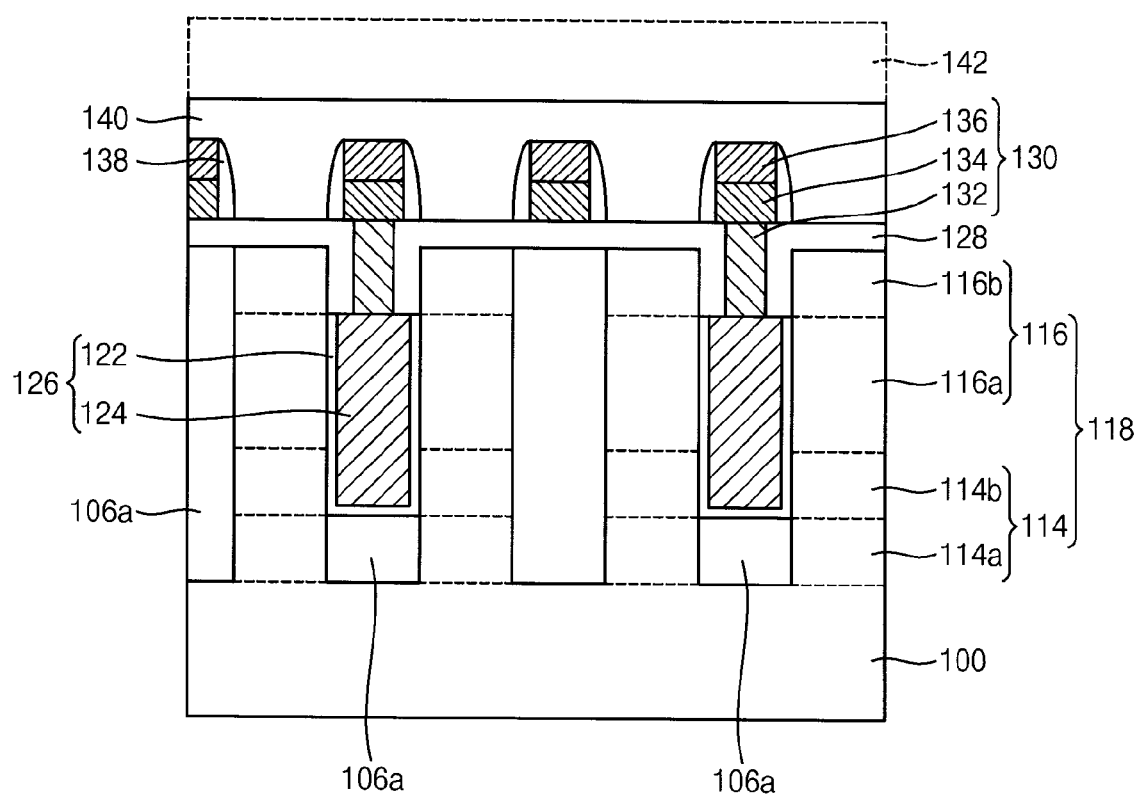

Referring to FIGS. 19 and 20, a second insulating interlayer 140 may be formed on the first insulating interlayer 128 and the word line structure 130 to substantially fill the space between the spacers 138. The second insulating interlayer 140 may be formed to include a material having an etching selectivity with respect to the hard mask 136 and the spacers 138, which may, for example, include silicon oxide.

In an example embodiment, the second insulating interlayer 140 may be further planarized until a top surface of the hard mask 136 is exposed.

A third etching mask 142 may be formed on the second insulating interlayer 140 and may extend in the second direction. The third etching mask 142 may be formed between the second semiconductor patterns 116.

The third etching mask 142 and the hard mask 136 may intersect each other at a substantially right angle, with the etching mask 142 and the hard mask 136 formed at different heights. Thus, the second semiconductor patterns 116 may not be overlapped by the third etching mask 142 and the hard mask 136.

Figure 21:
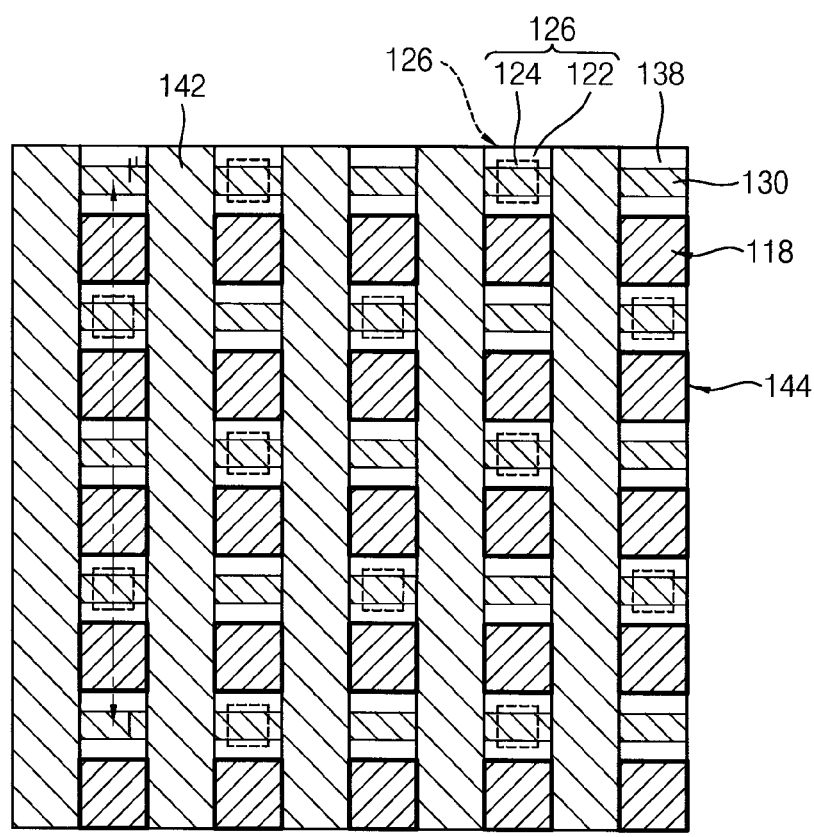
Figure 22:
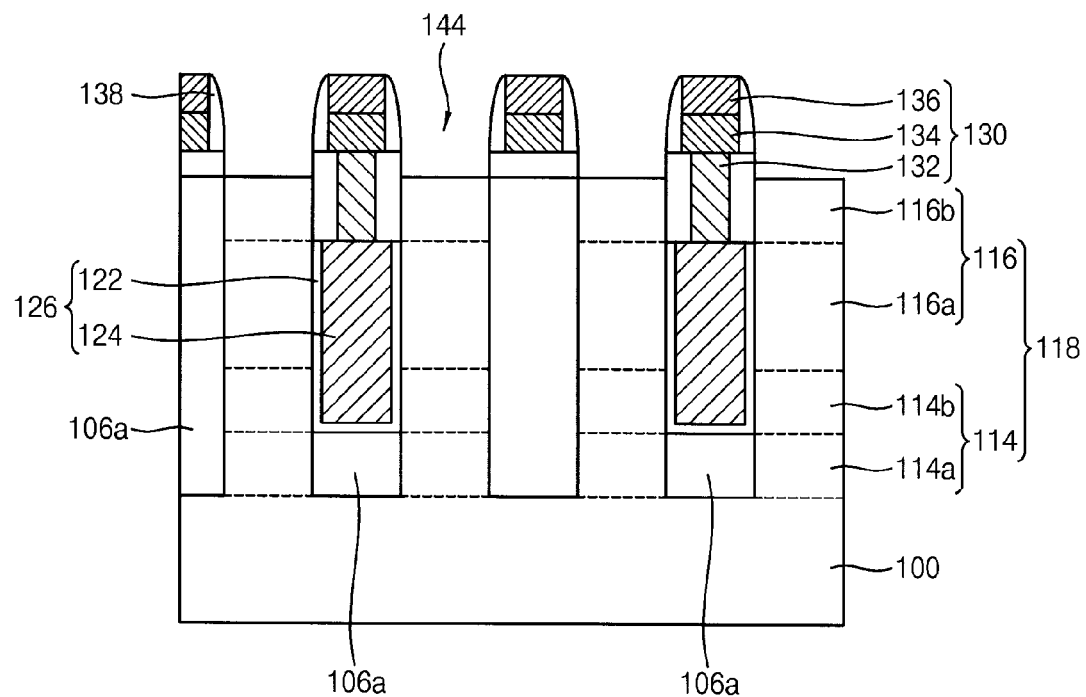

Referring additionally to FIGS. 21 and 22, the first and second insulating interlayers 128 and 140, respectively, may be anisotropic ally etched using the third etching mask 142 and the hard mask 136 as an etching mask to form a second contact hole 144 therethrough. Each second contact hole may expose a top surface of a corresponding one of the second semiconductor patterns 116. That is, the second contact hole 144 may expose the drain region 116b of a second semiconductor pattern 116.

More specifically, a portion of the second insulating interlayer 140 extending in the second direction may be etched using the third etching mask 142 as an etching mask. A portion of the second insulating interlayer 140 between the hard masks 136 of the word line structures 130 may be etched, and a portion of the first insulating interlayer 128 thereunder may be etched to form the second contact hole 144 between the word line structures 130.

Figure 24:
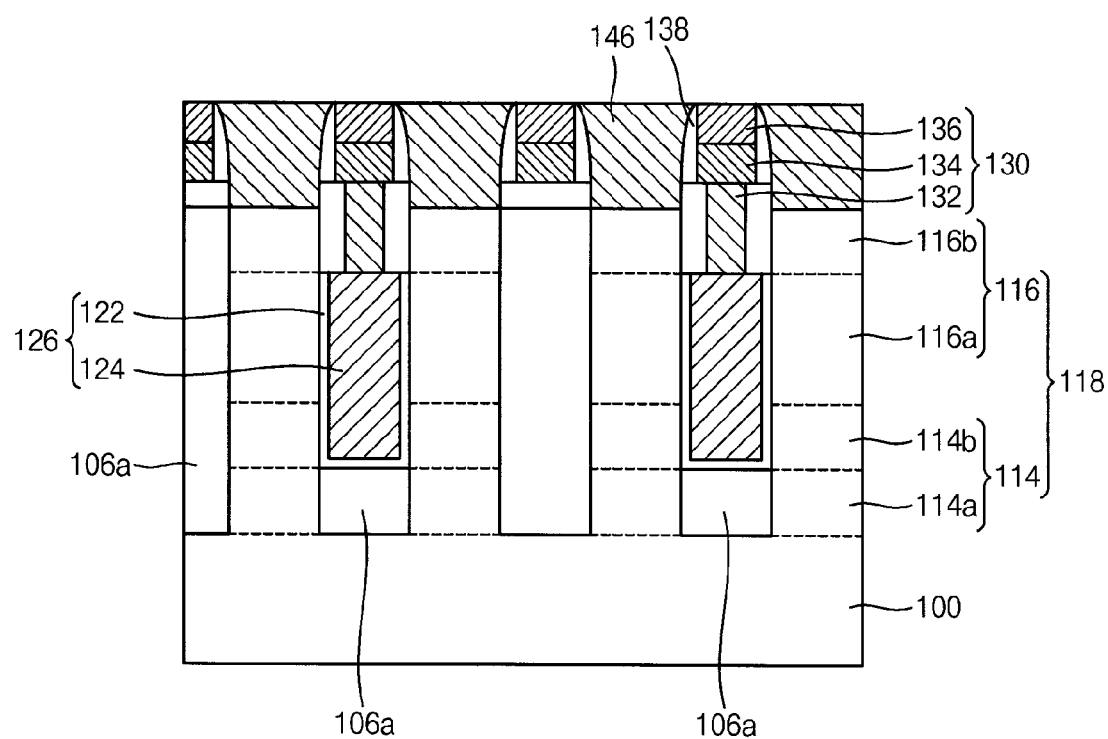

Referring additionally to FIGS. 23 and 24, a contact plug 146 may be formed in the second contact hole 144.

More specifically, a conductive layer may be formed to fill the second contact hole 144. The conductive layer may then be planarized until a top surface of the word line structures 130 is exposed. In example embodiments, the planarization process may be performed by a CMP process and/or an etch back process. Thus, the contact plug 146 may be formed to contact the drain region 116b.

In example embodiments, a plurality of contact plugs 146 may be arranged linearly in both the first and second directions in a similar arrangement to the second semiconductor patterns 116.

Figure 25:
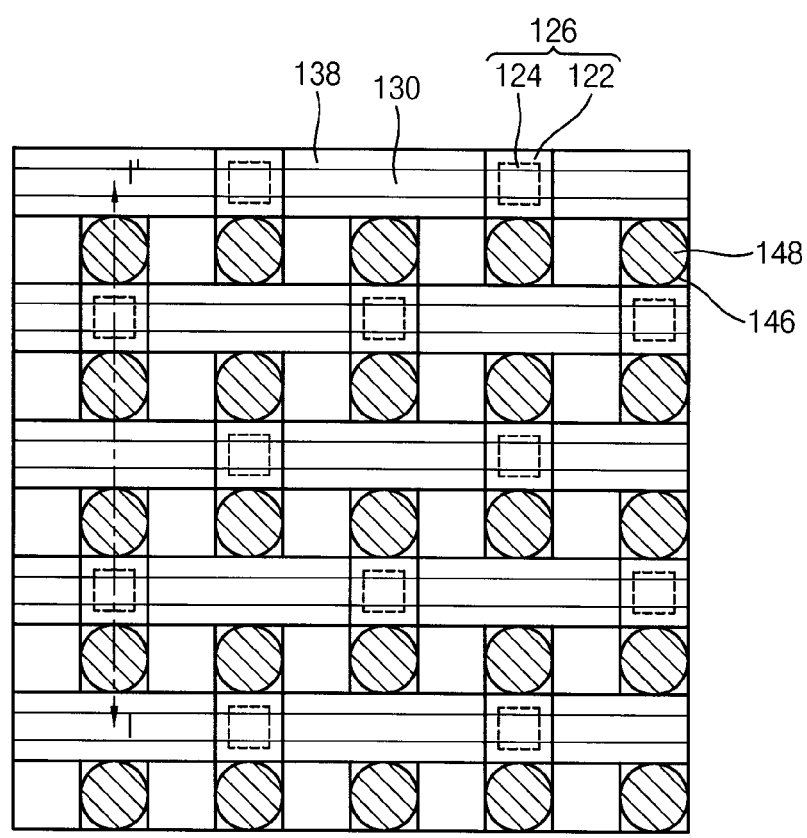
Figure 26:
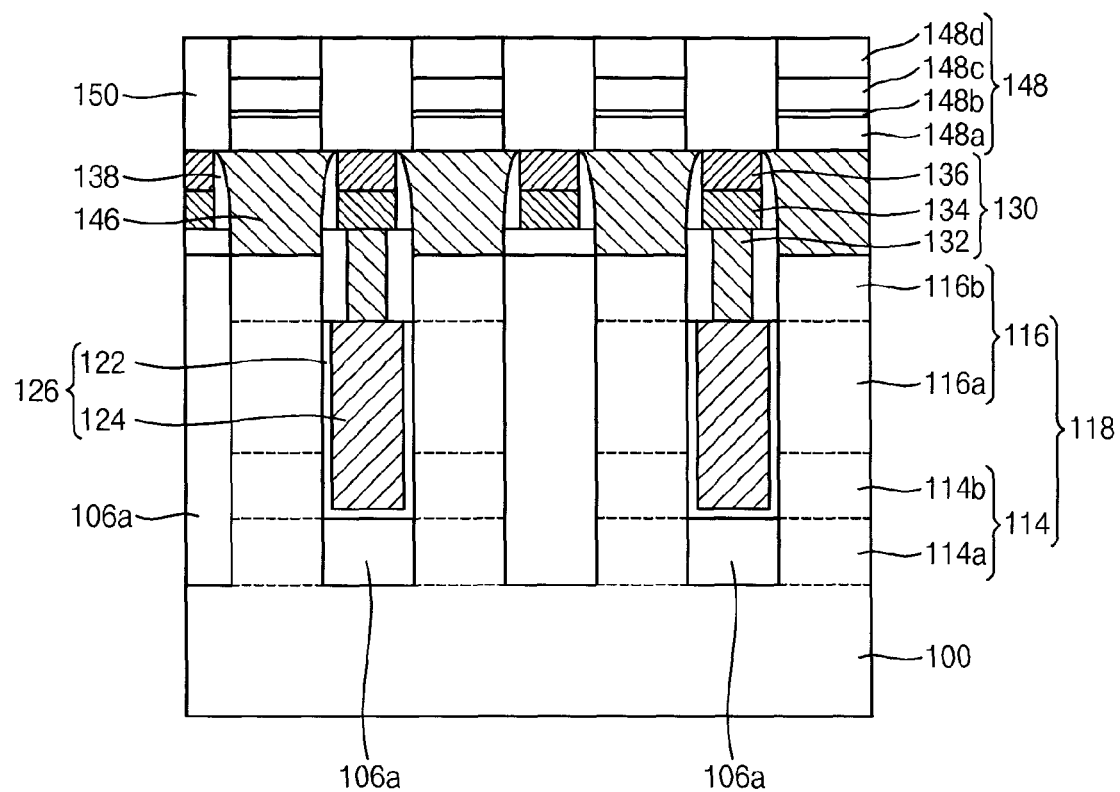

Referring additionally to FIGS. 25 and 26, an MTJ structure 148 may be formed on each of the contact plugs 146. In example embodiments, The MTJ structure 148 may include a fixed layer structure 148a, a tunnel barrier layer pattern 148b, a free layer pattern 148c, and an upper electrode 148d that are sequentially stacked.

More specifically, an MTJ layer may be formed on the contact plugs 146 and the word line structures 130. The MTJ layer may include a sequentially stacked fixed layer, tunnel barrier layer, free layer, and upper electrode layer. The upper electrode layer may be partially etched to form an upper electrode 148d. The free layer, the tunnel barrier layer, and the fixed layer may be etched using the upper electrode 148d as an etching mask to form the MTJ structure 148.

In example embodiments, a plurality of MTJ structures 148 may be formed on the plurality of contact plugs 146, each on a respective one of the contact plugs 146. The MTJ structures may thus be arranged in a substantially linear manner in both the first and second directions.

A third insulating interlayer 150 may be formed in a space between the MTJ structures 148. The third insulating interlayer 150 may be formed by a planarization process to have a top surface that is substantially coplanar with top surfaces of the MTJ structures 148.

Referring additionally to FIGS. 27 and 28, a pad pattern 154 may be formed on the MTJ structures 148 and the third insulating interlayer 150. A fourth insulating interlayer 152 may be formed in a space between the pad patterns 154.

The pad pattern 154 may be formed on two adjacent MTJ structures 148, and the two adjacent MTJ structures 148 may be electrically connected to each other via the pad patterns 154. In example embodiments, viewed in plan view, a plurality of pad patterns 154 may be disposed in a zigzag manner in the first direction. Each of the pad patterns 154 may, for example, include a metal, a metal nitride, etc.

In example embodiments, a pad layer may be formed on the MTJ structures 148 and the third insulating interlayer 150, and the pad layer may be patterned by performing a photolithography process to form the pad patterns 154. The fourth insulating interlayer 152 may then be formed between the pad patterns 154.

Alternatively, the pad pattern 154 may be formed by a damascene process. That is, the fourth insulating interlayer 152 may be formed on the MTJ structures 148 and the third insulating interlayer 150, and the fourth insulating interlayer 152 may be partially etched to form an opening for forming the pad patterns 154. A pad layer may be formed to fill the opening, and the pad layer may be planarized until a top surface of the fourth insulating interlayer 152 is exposed to form the pad patterns 154.

Referring additionally to FIGS. 29 and 30, a fifth insulating interlayer 156 may be formed on the pad patterns 154 and the fourth insulating interlayer 152. An upper contact 158 may be formed through the fifth insulating interlayer 156 to contact each of the pad patterns 154. A bit line 160 may be formed on the upper contact 158 and the fifth insulating interlayer 156.

More specifically, the fifth insulating interlayer 156 may be partially etched to form a contact hole therethrough that exposes a center portion in the first direction of an upper surface of each of the pad patterns 154. That is, the contact hole may be formed to overlap the space between the MTJ structures 148. A conductive layer may be formed to fill the contact hole, and the conductive layer may be planarized to form the upper contact 158. Viewed in plan view, the upper contacts 158 may be disposed in a zigzag fashion in the first and second directions.

A bit line layer may be formed on the upper contact 158 and the fifth insulating interlayer 156. A hard mask (not shown) may be formed on the bit line layer. The bit line layer may be etched using the hard mask as an etching mask to form a bit line 160 contacting the upper contact 158 and extending in the second direction. The bit line 160 may be formed to overlap the space between the MTJ structures 148.

As described above, in an MRAM device constructed according to principles of the present inventive concepts, a signal line may be shared. A transistor may be formed to include a channel body region 114*b*. Thus, the MRAM device according to principles of the present inventive concepts may be highly integrated. The channel region of the transistor may further be prevented from floating due to accumulated charges, so that the MRAM device may have good performance characteristics.

Figure 31:
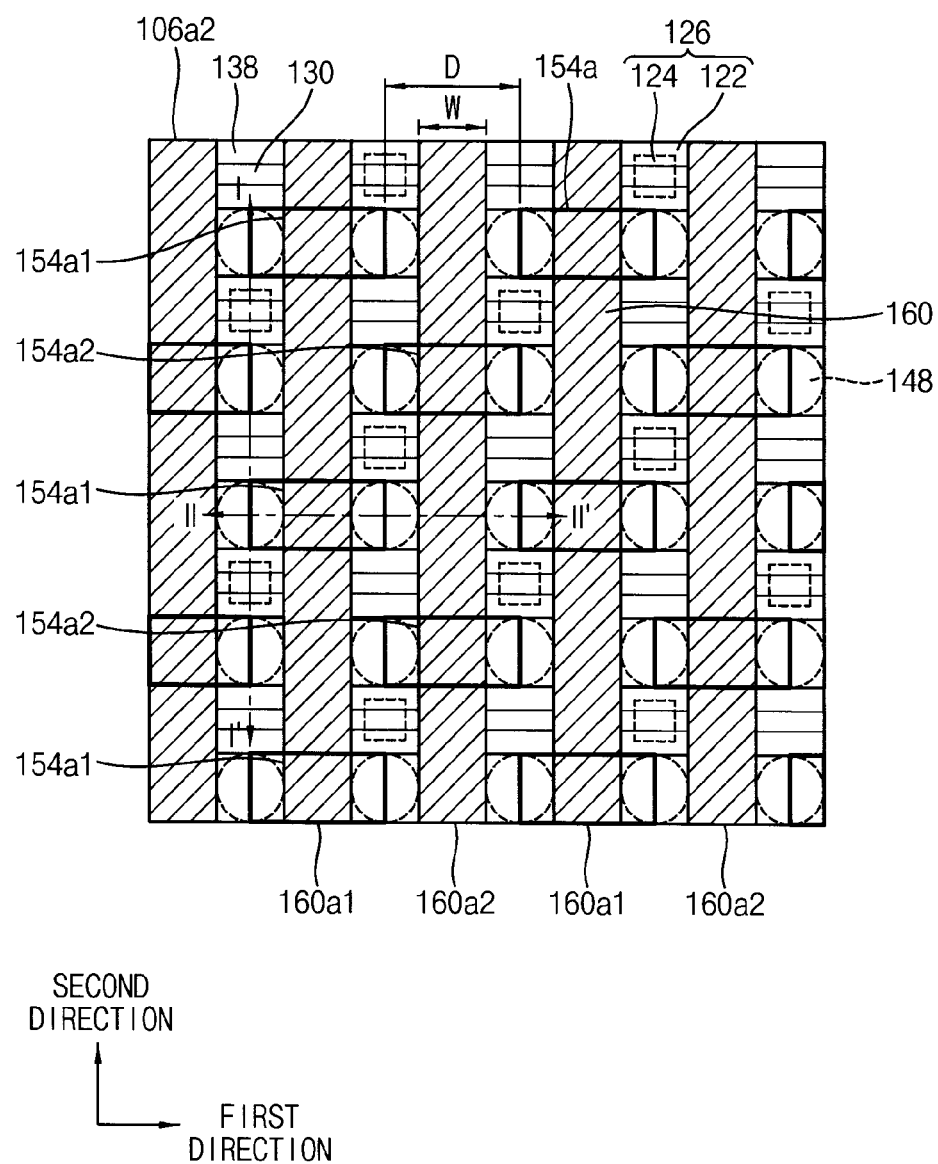
Figure 32:
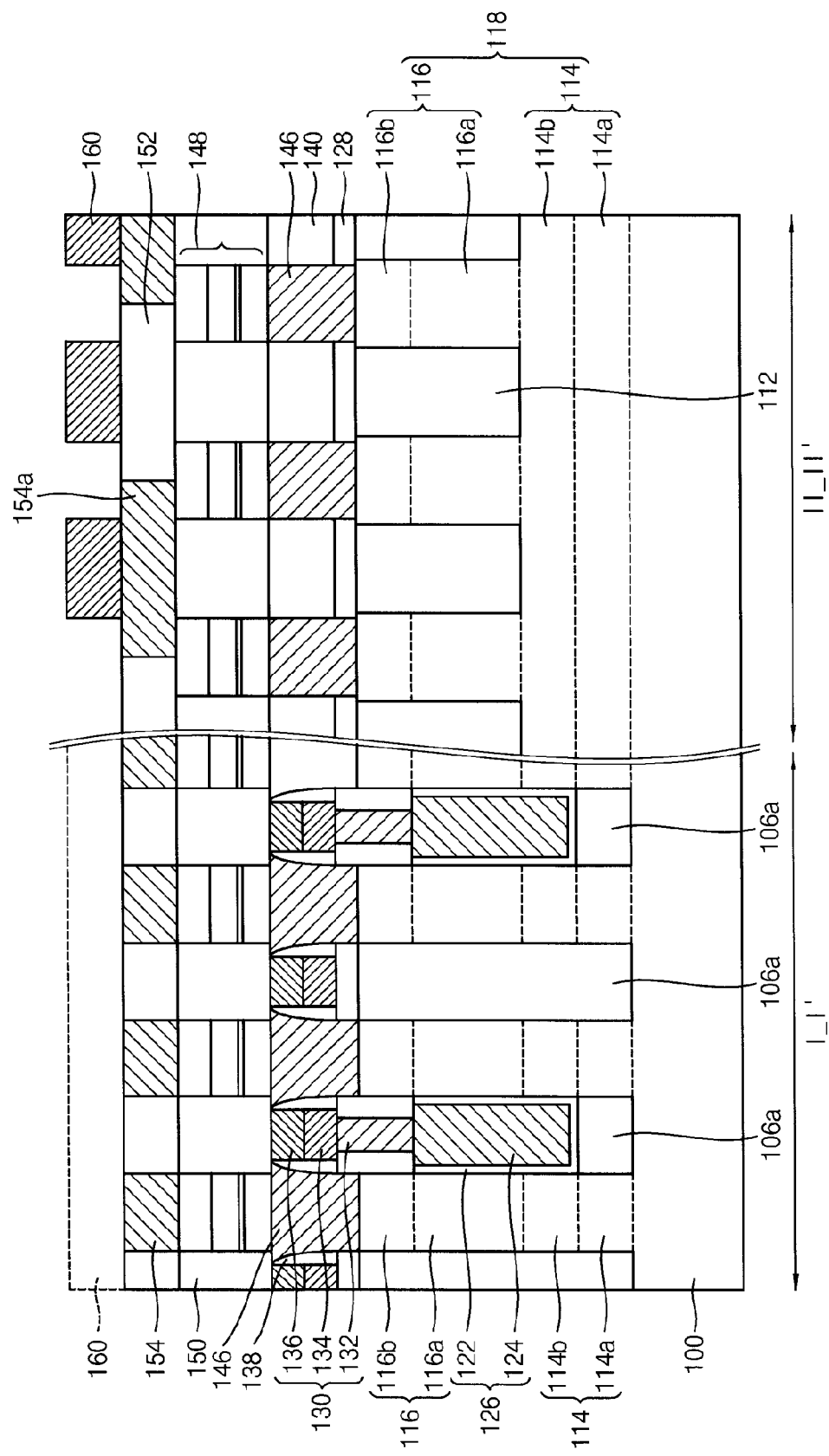

FIG. 31 is a plan view illustrating an MRAM device in accordance with another example embodiment. FIG. 32 provides cross-sectional views cut along line I-I' and II-II' of FIG. 31.

The MRAM device of FIG. 31 may be substantially the same as, or similar to, that illustrated and described previously with reference to FIG. 1, except for with respect to the upper contact and the pad pattern.

Referring to FIG. 31, the MRAM device according to this embodiment may include no upper contact, and a bit line 160 may instead directly contact pad patterns 154*a*. The pad patterns 154*a* may include first pad patterns 154*a*1 and second pad patterns 154*a*2.

First pad patterns 154*a*1, arranged on the semiconductor structures 118 in odd-numbered columns in the second direction, may be shifted in the first direction from second pad patterns 154*a*2 on the semiconductor structures 118 in even-numbered columns The pad patterns 154*a* may therefore be disposed in a zigzag arrangement substantially the same as that of FIG. 1.

With the pad patterns 154*a* disposed in a zigzag fashion, each of the bit lines 160 may contact corresponding ones of the pad patterns 154*a* in the odd-numbered columns or in the even-numbered columns In example embodiments, bit lines 160*a*2 arranged in the second direction along odd-numbered columns may contact the second pad patterns 154*a*2 and may overlap a space between the first pad patterns 154*a*1. Bit lines 160*a*1 in the even-numbered columns may contact the first pad patterns 154*a*1 of the pad patterns 154*a*, and may overlap a space between the second pad patterns 154*a*2.

The bit lines 160*a*2 in the odd-numbered columns may be arranged so as not to contact the first pad patterns 154*a*1, and the bit lines 160*a*1 in the even-numbered columns may be arranged so as not to contact the second pad patterns 154*a*2. A distance D between the pad patterns 154*a* in the first direction may therefore be greater than a width W of the bit line 160 in the first direction.

In order to increase the distance D, each of the pad patterns 154*a* may be formed to only partially cover upper surfaces of the respective two adjacent MTJ structures 148.

The MRAM device may be manufactured by performing the processes substantially the same as, or similar to, those illustrated and described previously with reference to FIGS. 6 to 30, except that in the present embodiment, no upper contact is formed.

Figure 33:
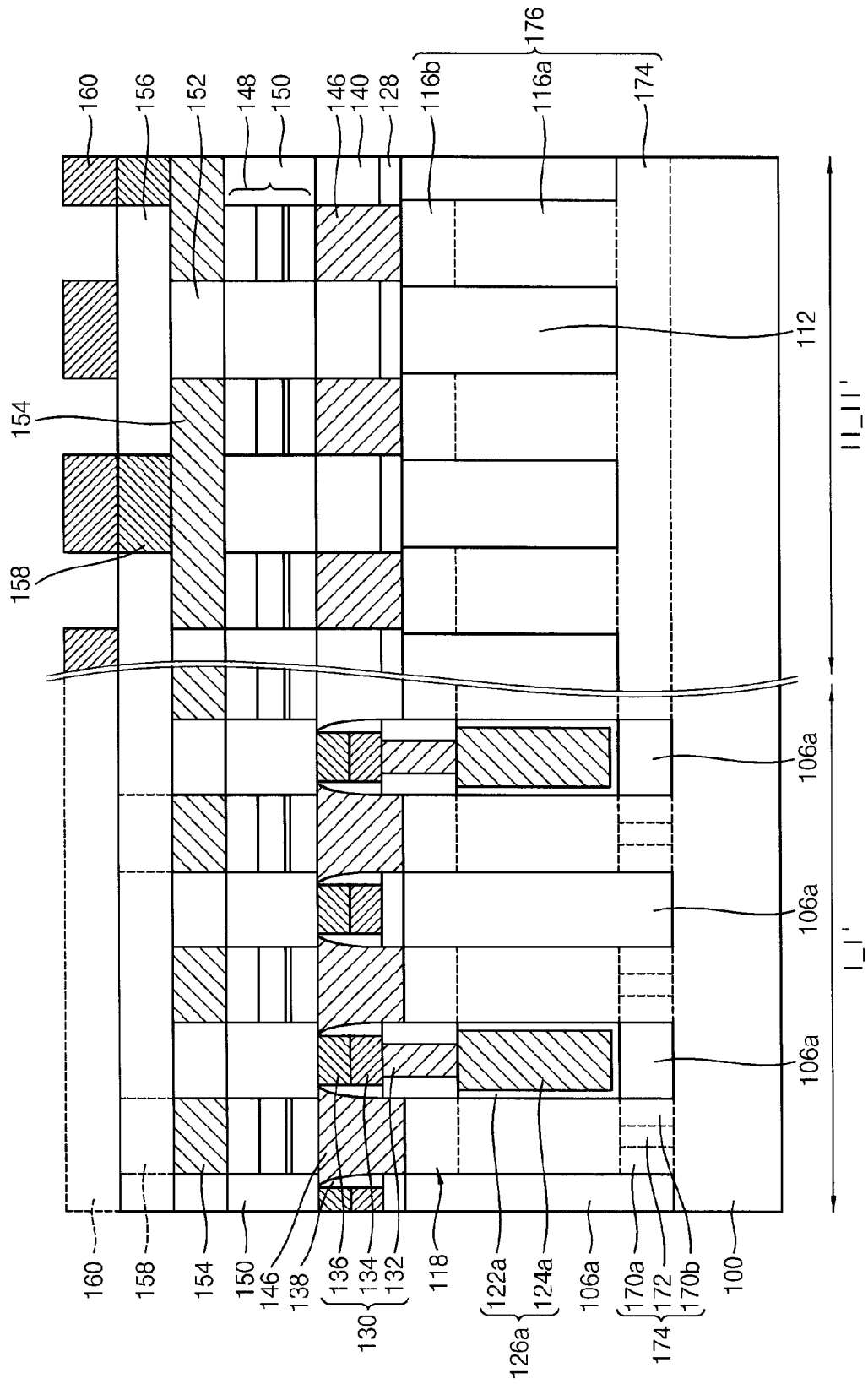
Figure 34:
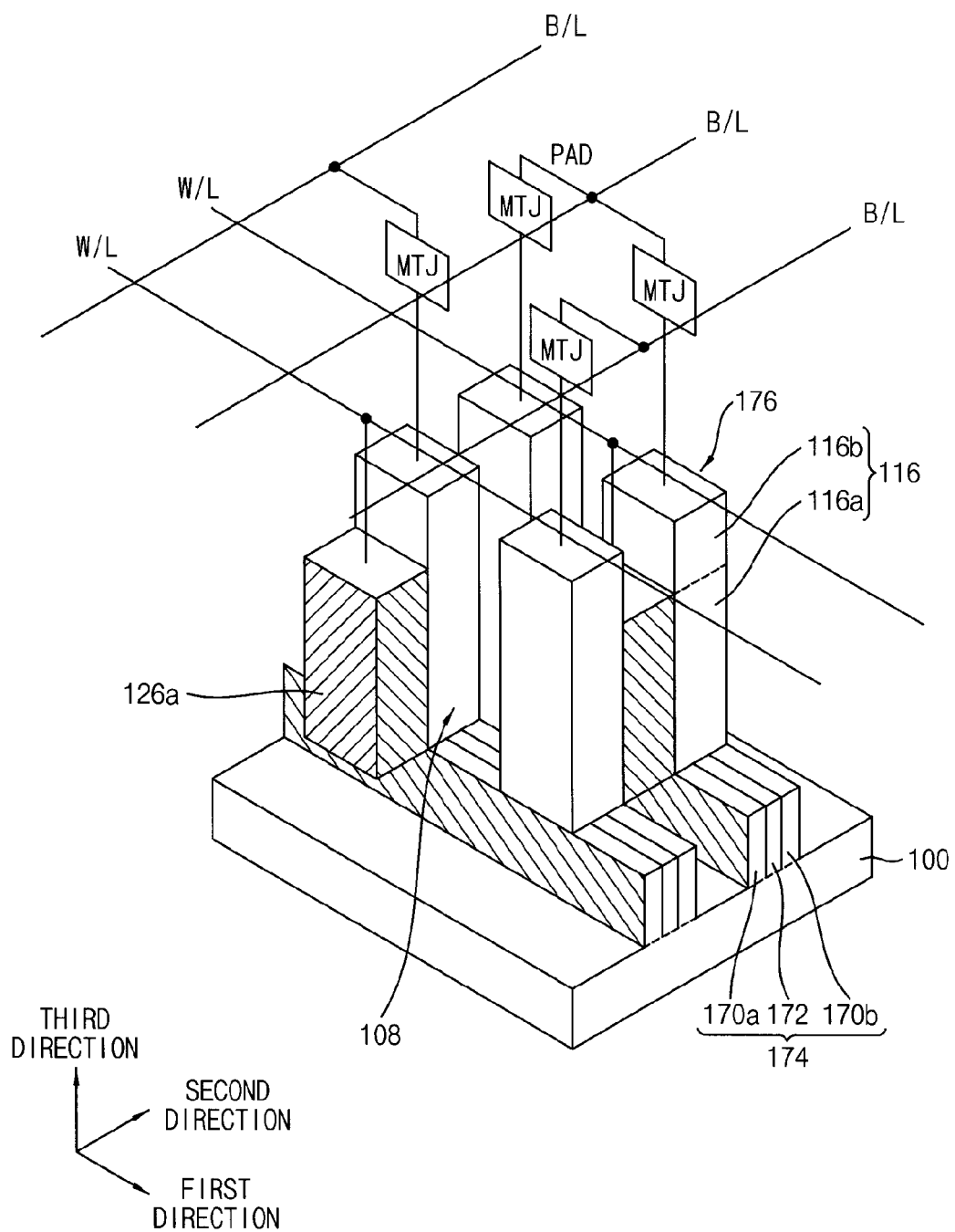

FIG. 33 provides cross-sectional views illustrating the MRAM device of FIG. 1 in accordance with yet another example embodiment. FIG. 34 is a perspective view of a portion of the MRAM device of FIG. 31.

A plan view of the MRAM device of FIG. 31 may be substantially the same as FIG. 1. FIG. 33 provides cross-sectional views cut along lines I-I' and II-II' of FIG. 1.

Referring to FIG. 33, the MRAM device may include a vertical channel transistor, a first source line 170*a*, a second source line 170*b*, a channel body region 172, a word line structure 130, an MTJ structure 148, and a bit line 160. The MRAM device of FIG. 32 may be substantially the same as, or similar to, that of FIG. 33, except for with respect to the vertical channel transistor, the first and second source lines 170*a* and 170*b*, respectively, and the channel body region 172.

Referring additionally to FIG. 34, a semiconductor structure 176 including a first semiconductor pattern 174 and second semiconductor patterns 116 may be formed on a substrate 100. The first semiconductor pattern 174 may have a substantially linear shape extending in the first direction, and each of the second semiconductor patterns 116 may have a pillar shape protruding in the third direction, where the third direction is substantially perpendicular to the top surface of the substrate 100. That is, in a cross-sectional view, the first and second semiconductor patterns 174 and 116 may form a substantially comb-like shape.

The first semiconductor pattern 174 may include the first and second source lines 170*a* and 170*b*, respectively, and the channel body region 172, each extending in the first direction. The first source line 170*a*, the channel body region 172, and the second source line 170*b* may be sequentially disposed in the second direction. That is, the channel body region 172 may be formed between the first and second source lines 170*a* and 170*b*, respectively.

The first and second source lines 170*a* and 170*b*, respectively, may be doped with impurities of a first conductivity type. In example embodiments, the first and second source lines 170*a* and 170*b*, respectively, may be doped with N+ type impurities. The first and second source lines 170*a* and 170*b*, respectively, may serve as a source region of each of the transistors. Source regions of the transistors formed in the first direction may be electrically connected to each other by the first and second source lines 170*a* and 170*b*, respectively.

The channel body region 172 may be doped with impurities of a second conductivity type that is different from the first conductivity type. In example embodiments, the channel body region 172 may be doped with P type impurities.

Each of the second semiconductor patterns 116 may include an upper portion and a lower portion disposed in the third direction. The lower portion of each of the second semiconductor patterns 116 may serve as a channel region 116a of the transistor, and the upper portion of each of the first semiconductor patterns 116 may serve as a drain region 116b of the transistor. Thus, one transistor may be formed on each of the second semiconductor patterns 116.

The channel region 116a may be doped with impurities of the second conductivity type, which may be the same as that of the channel body region 114b. The drain region 116b may be doped with impurities of the first conductivity type, which may be the same as that of the first and second source lines 170a and 170b, respectively.

The channel regions 116a of the transistors formed in the first direction may be electrically connected to each other by the channel body region 172. The channel body region 172 may provide a path for discharging accumulated charges in the channel regions 116a. Thus, the channel regions 116a may be prevented from floating due to accumulated charges.

The semiconductor structures 118 may include a first trench 102 and a second trench 108 therein. The first trench 102 may be formed between first semiconductor patterns 114, and the second trench 108 may be formed between second semiconductor patterns 116.

A gate structure 126a may be formed in the first trench 102. The gate structure 126a may include a gate insulation layer 122a and a gate electrode 124a. The gate structure 126a may have a substantially pillar shape.

The gate structure 126a may abut each of the channel regions 116a, but may not abut the channel body region 172 thereunder. Particularly, the gate insulation layer 122a of the gate structure 126a may directly contact the channel region 116a, but may not contact the channel body region 172. Thus, when a voltage greater than a threshold voltage is applied to the gate electrode 124a, a vertical channel may not be formed at the channel body region 172. The channel body region 172 may be electrically connected to the channel regions 116a of the transistors.

The gate structure 126a may be disposed in plan view as shown in FIG. 1. That is, the gate structure 126a may be disposed in a zigzag fashion in plan view.

The word line structure 130, the MTJ structures 148, and the bit line 160 may each be formed on the gate structure. The word line structure 130, the MTJ structures 148, and the bit line 160 may be substantially the same as, or similar to, those previously described and illustrated with reference to FIG. 1.

As described above, accumulated charges in the channel regions may be discharged through the channel body region 172 of the MRAM device according to the present inventive concepts. In the MRAM device of the present inventive concepts, the signal lines may also be shared, so that an area of a unit memory cell may decrease. Thus, the MRAM device may have good characteristics and may be highly integrated.

FIGS. 35 to 38 are a plan view, cross-sectional views, and a perspective view, respectively, illustrating the MRAM device of FIG. 33 during various stages of manufacturing.

Figure 35:
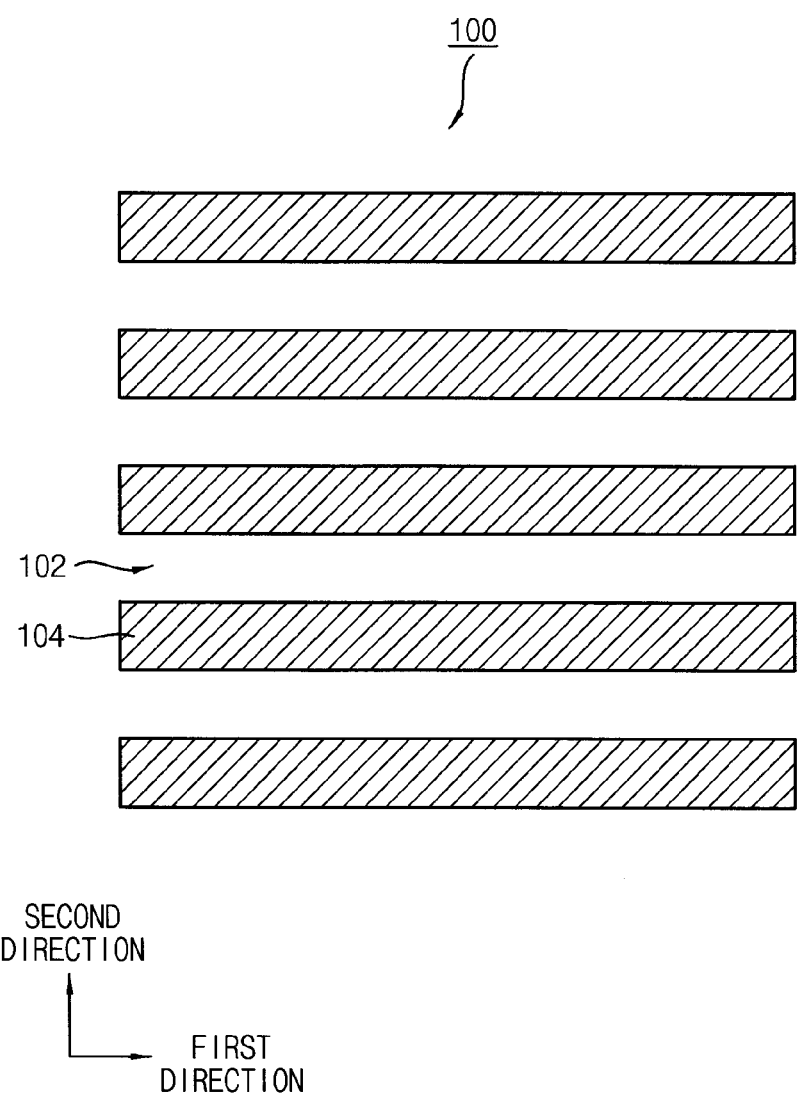
Figure 36:
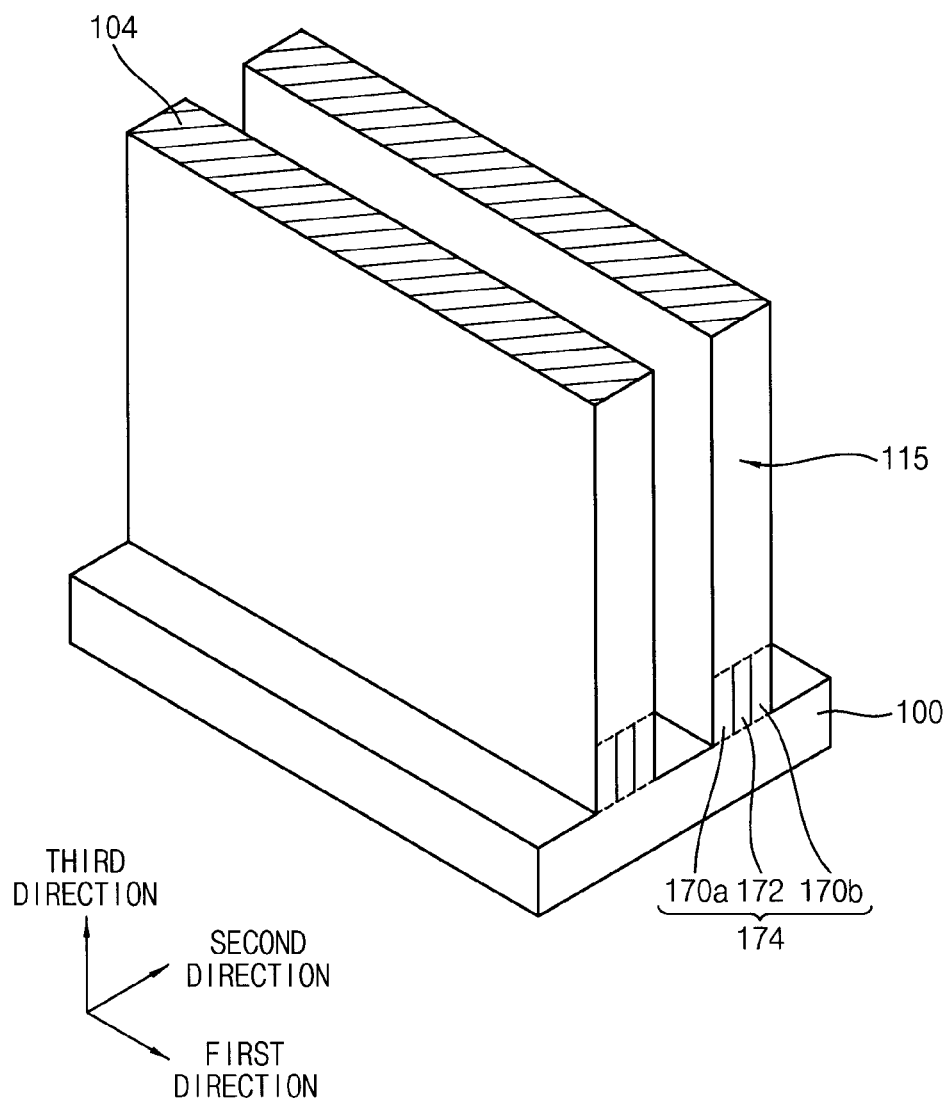
Figure 37:
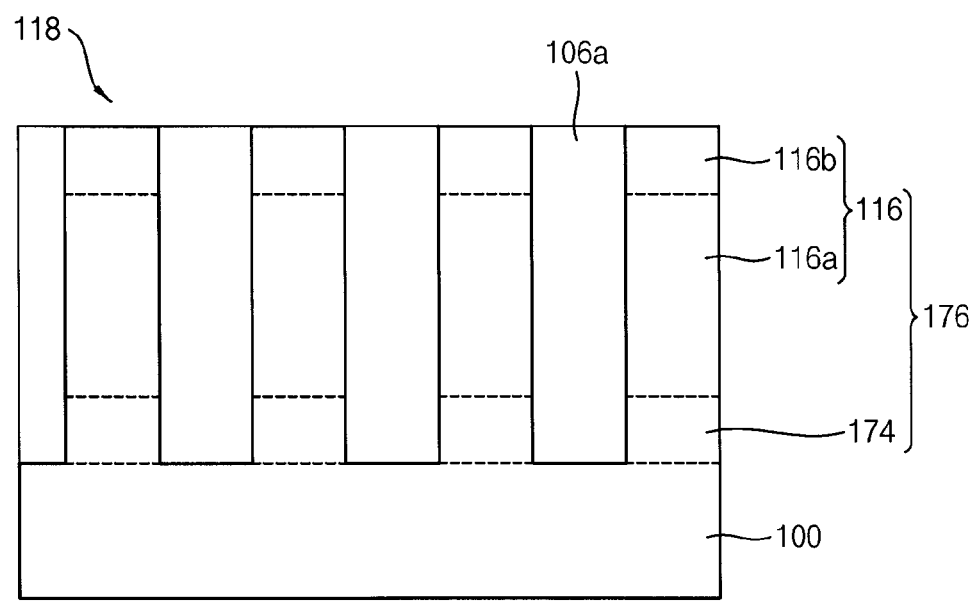
Figure 38:
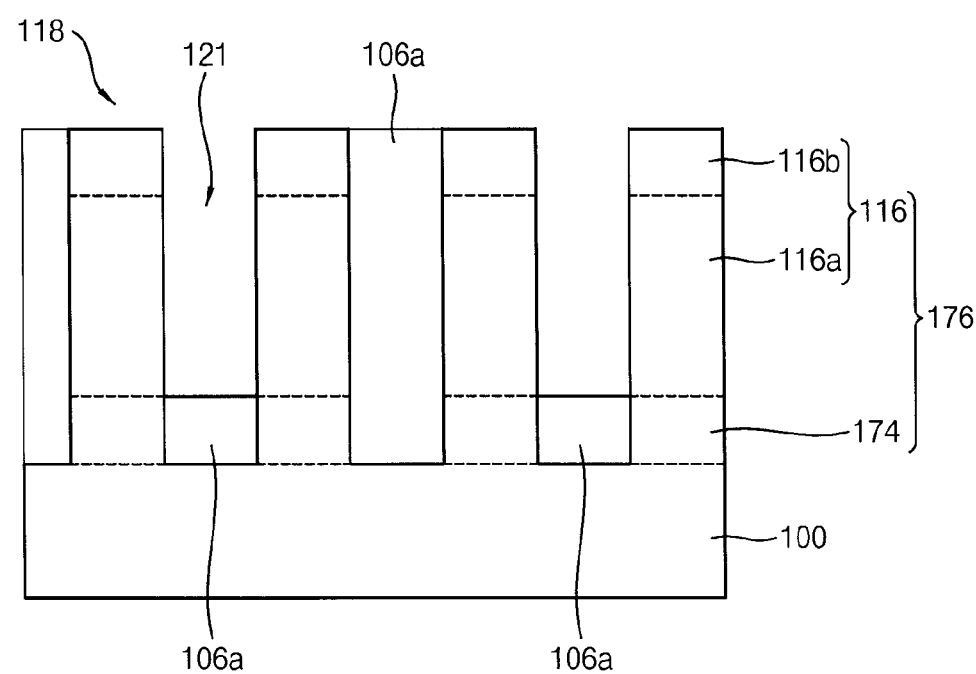

FIGS. 35 and 36 provide a plan view and a perspective view, respectively. FIGS. 37 and 38 provide cross-sectional views of the MRAM device cut along the second direction.

Referring to FIGS. 35 and 36, a first etching mask (not shown) extending in a first direction may be formed on a substrate 100. The substrate 100 may be anisotropically etched using the first etching mask to form a plurality of first trenches 102. A plurality of preliminary semiconductor patterns 104 may be formed between the first trenches 102.

In example embodiments, the substrate 100 may be doped with second impurities to form a channel body region and a channel region, before or after forming the first trench 102. Also, lower lateral portions each of the preliminary semiconductor patterns 104 may be doped with first impurities to form a first source line and a second source line.

More specifically, as shown in FIG. 36, a first source line 170a, a channel body region 172, and a second source line 170b may be sequentially formed in the second direction at a lower portion of each of the preliminary semiconductor patterns 104. A preliminary channel body region 115 may be formed on the first source line 170a, the channel body region 172, and the second source line 170b. However, the order of the doping process need not be limited thereto. In example embodiments, the first source line 170a, the channel body region 172, and the second source line 170b may be subsequently formed.

Referring to FIG. 37, processes substantially the same as, or similar to, those illustrated and described previously with reference to FIGS. 7 to 12 may be performed. Thus, a semiconductor structure 176, a first insulation pattern 106a, and a second insulation pattern 112 (see FIGS. 10 and 11) may be formed, and a drain region 116b may be formed in the semiconductor structure 176.

Referring to FIG. 38, a third etching mask (not shown) may be formed to expose portions of the semiconductor structure 176 and the first and second insulation patterns 106a and 112a, respectively, for forming gate structures. The first insulation pattern 106a may be partially etched using the third etching mask to form third trenches 121.

The drain region 116b and the channel region 116a may be exposed to a sidewall of each of the third trenches 121. A bottom of each of the third trenches 121 may be substantially coplanar with, or lower than, a top surface of the first and second source lines 170a and 170b, respectively. Thus, the channel body region 172 may not be exposed to the sidewall of each of the third trenches 121.

Each of the third trenches 121 may be formed to expose every other one of the channel regions 116a arranged in the first direction. Thus, in plan view, the third trenches 121 may be disposed in the same manner as the third trenches 120 illustrated in FIG. 13.

Processes substantially the same as, or similar to, those illustrated and described previously with reference to FIGS. 15 to 30 may then be performed to form the MRAM device of FIG. 33.

As described above, in an MRAM device constructed according to principles of the present inventive concepts, signal lines may be shared. A transistor may be formed to include the channel body region. Thus, the MRAM device may have good characteristics and may be highly integrated.

Figure 39:
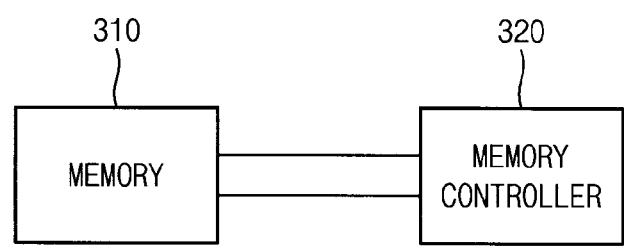

FIG. 39 is a block diagram illustrating a memory system in accordance with further example embodiments.

Referring to FIG. 39, the memory system may include a memory controller 320 and a memory 310 connected to the memory controller 320. The memory 310 may, for instance, include an MRAM device constructed according to one or more of the example embodiments. The memory controller 320 may provide a control signal for controlling the memory 310.

The MRAM device according to the present inventive concepts may be used in various types of electronic devices, e.g., mobile devices, memory cards, computers, etc. The MRAM device of the present inventive concepts is not limited to the specific example embodiments shown and described herein, but should be interpreted to include all such devices falling within the spirit and scope of the following claims.

What is claimed is:

1. A magnetoresistive random access memory device, comprising:
   a plurality of semiconductor structures arranged on a substrate, wherein each of the semiconductor structures includes a first semiconductor pattern and second semiconductor patterns on the first semiconductor pattern, the first semiconductor pattern having a substantially linear shape extending in a first direction, wherein the first direction is substantially parallel to a top surface of the substrate, each of the second semiconductor patterns extending in a third direction, wherein the third direction is substantially perpendicular to the top surface of the substrate, and the plurality of semiconductor structures being arranged in a second direction, wherein the second direction is substantially perpendicular to both the first direction and the third direction;
   a common source region, a drain region, and a channel region provided in each of the semiconductor structures, wherein a corresponding common source region and drain region are spaced apart from each other in the third direction, and wherein a corresponding channel region is arranged between the corresponding common source and drain regions;
   a plurality of gate structures, wherein a single gate structure is arranged between at least two second semiconductor patterns that are adjacent to each other in the second direction, such that each of the gate structures serves as a common gate electrode for corresponding second semiconductor patterns;
   a plurality of word line structures, each word line structure electrically connecting multiple gate structures arranged in the first direction to each other;
   a plurality of MTJ structures, each MTJ structure electrically connected to an upper portion of a corresponding one of the second semiconductor patterns; and
   a plurality of bit line structures, wherein each of the bit line structures is electrically connected to two MTJ structures adjacent to each other in the first direction, each of the bit line structures extends in the second direction, and is also electrically connected a plurality of MTJ structure groups arranged in the second direction, wherein each pair of electrically connected adjacent MTJ structures forms an MTJ structure group.

2. The device of claim 1, wherein each of the gate structures has a substantially pillar shape.

3. The device of claim 1, wherein each of the gate structures includes a gate insulation layer and a gate electrode, and wherein the gate insulation layer contacts sidewalls of the semiconductor structures adjacent to each other in the second direction, and wherein the gate insulation layer further has a substantially cup-like shape surrounding a sidewall and a lower surface of the gate electrode.

4. The device of claim 1, wherein the second semiconductor patterns each include third semiconductor patterns abutting the gate structures in the second direction and fourth semiconductor patterns not abutting the gate structures in the second direction, wherein the third and fourth semiconductor patterns are alternately disposed in the first direction.

5. The device of claim 1, wherein bottom surfaces of the gate structures are substantially coplanar with, or lower than, an upper surface of the common source region.

6. The device of claim 1, wherein each of the word line structures extends on the gate structures in the first direction.

7. The device of claim 1, wherein the common source region and the drain region are doped with impurities having a first conductivity type, and wherein the common source region is formed extending in the first direction in the first semiconductor pattern, and wherein the drain region is formed at an upper portion of the second semiconductor pattern.

8. The device of claim 7, wherein the channel region is formed in the second semiconductor pattern between the common source region and the drain region, and wherein the channel region is doped with impurities having a second conductivity type that is different from the first conductivity type.

9. The device of claim 7, further comprising a channel body region arranged on the common source region of the first semiconductor pattern, wherein the channel body region is electrically connected to a lower portion of the channel region and extends in the first direction, and wherein the channel body region is doped with impurities having a second conductivity type that is different from the first conductivity type.

10. The device of claim 7, wherein the common source region is formed at sidewalls of the first semiconductor pattern, and wherein the device further comprises:
    a channel body region arranged in the first semiconductor pattern between the common source lines, wherein the channel body region is electrically connected to a lower portion of the channel region and extends in the first direction, and wherein the channel body is doped with impurities having a second conductivity type that is different from the first conductivity type.

11. The device of claim 1, further comprising:
    pad patterns arranged on the MTJ structures, wherein each of the pad patterns electrically connects the two adjacent MTJ structures in the first direction; and
    upper contacts arranged on the pad patterns to contact the bit line.

12. The device of claim 11, wherein the pad patterns are disposed in a zigzag fashion in the first direction when viewed in a plan view.

13. A magnetoresistive random access memory, comprising:
    semiconductor structures arranged on a substrate, each of the semiconductor structures including a first semiconductor pattern and second semiconductor patterns on the first semiconductor pattern, wherein the first semiconductor pattern has a substantially linear shape extending in a first direction that is substantially parallel to a top surface of the substrate, wherein each of the second semiconductor patterns extends in a third direction that substantially perpendicular to the top surface of the substrate, and wherein the semiconductor structures are arranged in a second direction with respect to each other, wherein the second direction is substantially perpendicular to the first direction in a plan view;
    a common source region, a drain region, and a channel region formed in each of the semiconductor structures, the common source region and the drain region in each of the semiconductor structures being spaced apart from each other in the third direction, and the channel region being disposed between the common source region and the drain region in each of the semiconductor structures;

a channel body region formed in the second semiconductor patterns, wherein the channel body region is electrically connected to the channel region and extends in the first direction;

gate structures arranged between at least some of the second semiconductor patterns adjacent to each other in the second direction, wherein each of the gate structures serves as a shared gate electrode for two or more adjacent semiconductor patterns;

word line structures electrically connecting corresponding gate structures arranged in the first direction;

MTJ structures, each electrically connected to an upper portion of a corresponding one of the second semiconductor patterns; and bit line structures, each bit line structure electrically connecting two MTJ structures adjacent to each other in the first direction to each other to form an MTJ structure group, each of the bit line structures extending in the second direction, and also electrically connecting a plurality of MTJ structure groups arranged in the second direction with respect to each other.

14. The device of claim 13, wherein the common source region and the drain region are doped with impurities having a first conductivity type, and wherein the common source region and the drain region are sequentially formed in the first semiconductor pattern and wherein the source line and drain regions each extend in the first direction.

15. The device of claim 13, wherein the common source region and the channel body region are doped with impurities having different conductivity types from each other, and wherein the common source region is formed at sidewalls of the first semiconductor pattern, and wherein the channel body region is formed between the common source lines of the first semiconductor pattern.

16. A random access memory device, comprising:
a plurality of memory cells arranged in a grid-like pattern;
a plurality of common gate electrodes, each common gate electrode acting as a shared gate electrode for a pair of memory cells adjacent to each other in a second direction;
a plurality of word lines, each word line disposed along at first direction perpendicular to the second direction and connected between pairs of memory cells adjacent to each other in the second direction; and
a plurality of bit lines, each bit line electrically connected between memory cells in a memory cell group, each bit line extending in the second direction and further electrically connected to a plurality of memory cell groups arranged in the second direction,
wherein a pair of memory cells adjacent to each other in the first direction forms the memory cell structure group.

17. The random access memory device of claim 16, wherein the random access memory device is a magnetorestrictive random access memory device, and wherein each of the memory cells comprises an MTJ structure.

18. The random access memory device of claim 16, further comprising:
semiconductor structures each comprising a common source region, a drain region, and a channel region to provide a transistor, wherein the common source region and the drain region in each of the semiconductor structures are spaced apart from each other in a third direction that is substantially perpendicular to the first and second directions, and wherein the channel region is disposed between the common source region and the drain region in each of the semiconductor structures; and
a channel body region formed in the second semiconductor patterns, wherein the channel body region is electrically connected to the channel region and extends in the first direction to reduce a floating body effect of the transistor.

19. The random access memory device of claim 18, wherein each of the semiconductor structures includes a first semiconductor pattern and second semiconductor patterns, each first semiconductor pattern having a substantially linear shape extending in the first direction, and each of the second semiconductor patterns having a substantially pillar shape extending in the third direction.

20. The random access memory device of claim 19, wherein the common source region and the channel body region are doped with impurities having different conductivity types from each other, and wherein the common source region is formed at sidewalls of the first semiconductor pattern, and wherein the channel body region is formed between the common source regions of the first semiconductor pattern.

* * * * *